(12) United States Patent
Chang

(10) Patent No.: US 12,175,040 B2
(45) Date of Patent: Dec. 24, 2024

(54) ULTRASONIC SENSING DEVICES

(71) Applicant: SCHIATEK LIMITED COMPANY, Hsinchu County (TW)

(72) Inventor: Wen-Hua Chang, Hsinchu County (TW)

(73) Assignee: SCHIATEK LIMITED COMPANY, Hsinchu County (TW)

( * ) Notice: Subject to any disclaimer, the term of this patent is extended or adjusted under 35 U.S.C. 154(b) by 52 days.

(21) Appl. No.: 18/152,765

(22) Filed: Jan. 11, 2023

(65) Prior Publication Data

US 2023/0376146 A1  Nov. 23, 2023

Related U.S. Application Data

(60) Provisional application No. 63/343,556, filed on May 19, 2022.

(51) Int. Cl.
| | |
|---|---|
| *G06F 3/041* | (2006.01) |
| *B06B 1/02* | (2006.01) |
| *B06B 1/06* | (2006.01) |
| *G06F 3/043* | (2006.01) |
| *H10N 30/87* | (2023.01) |

(52) U.S. Cl.
CPC .......... *G06F 3/0418* (2013.01); *B06B 1/0215* (2013.01); *B06B 1/0644* (2013.01); *G06F 3/043* (2013.01); *H10N 30/87* (2023.02)

(58) Field of Classification Search
CPC ....... G06F 3/0418; G06F 3/043; H10N 30/87; B06B 1/0215; B06B 1/0644
See application file for complete search history.

(56) References Cited

U.S. PATENT DOCUMENTS

| | | | |
|---|---|---|---|
| 10,775,500 B2* | 9/2020 | Taghibakhsh | B06B 1/0622 |
| 2015/0016223 A1* | 1/2015 | Dickinson | G06F 3/043 |
| | | | 367/87 |

(Continued)

OTHER PUBLICATIONS

Hao-Yen Tang et al., "3-D Ultrasonic Fingerprint Sensor-on-a-Chip", 2016 IEEE International Solid-State Circuits Conference (ISSCC), Institute of Electrical and Electronics Engineers, 2016, pp. 202-203.

*Primary Examiner* — Amare Mengistu
*Assistant Examiner* — Jennifer L Zubajlo
(74) *Attorney, Agent, or Firm* — Idea Intellectual Limited; Margaret A. Burke; Sam T. Yip

(57) ABSTRACT

The present disclosure provides a device for ultrasonic sensing, which includes a driver circuit configured to generate an ultrasonic signal, a piezoelectric element having a first electrode and a second electrode, a blocking transistor configured to connect the piezoelectric element with the second electrode to a fixed bias voltage, and a source rectifier including a gate, a drain, and a source electrically connected to the piezoelectric element and the blocking transistor. The piezoelectric element is coupled with the driver circuit with the first electrode. The blocking transistor includes a gate for receiving a blocking control signal, a drain electrically connected to the second electrode of the piezoelectric element, and a source electrically connected to the fixed bias voltage, wherein, in response to the blocking signal, the blocking transistor is configured to be turned on within a transmission period and to be turned off within a receiving period.

30 Claims, 26 Drawing Sheets

(56) References Cited

U.S. PATENT DOCUMENTS

| | | | | |
|---|---|---|---|---|
| 2017/0285877 A1* | 10/2017 | Hinger | .................. | G01N 29/26 |
| 2020/0160021 A1* | 5/2020 | Feng | .................... | B06B 1/0238 |
| 2020/0363516 A1* | 11/2020 | Lu | ....................... | G01S 7/52026 |
| 2020/0410194 A1* | 12/2020 | Kim | .................... | G06V 40/1306 |
| 2021/0405808 A1* | 12/2021 | Cui | .................... | G06V 40/1306 |
| 2021/0406497 A1* | 12/2021 | Li | ...................... | G01S 15/8965 |

* cited by examiner

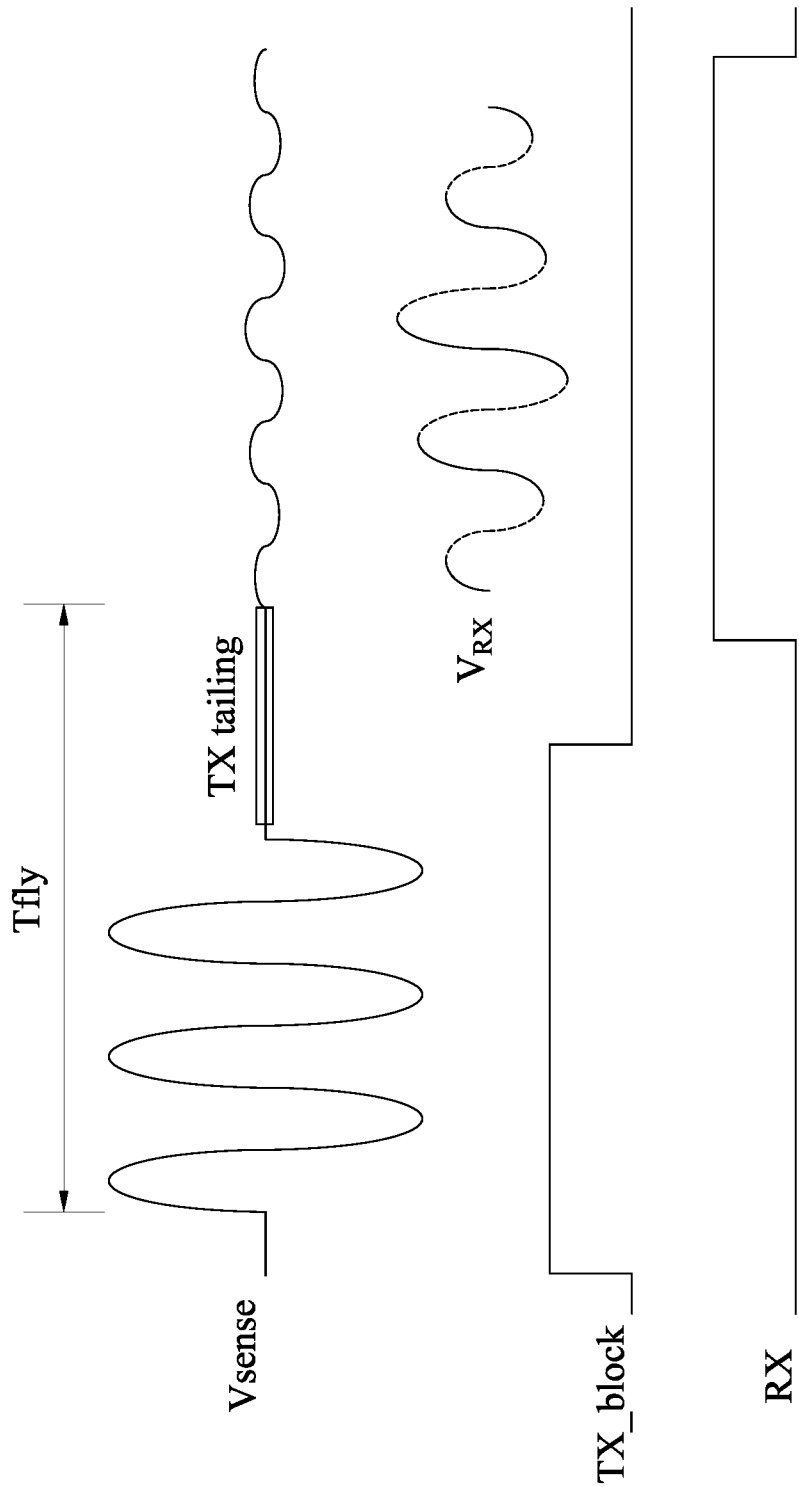

ULTRASONIC SENSING DEVICES

TECHNICAL FIELD

The present disclosure relates to a sensing device. In particular, the present disclosure relates to an ultrasonic sensing device capable of eliminate tailing signal.

BACKGROUND

Ultrasonic sensors are common in electronic device technology, and are often incorporated into touch displays (touch screen). Such ultrasonic sensors suffer from transmission tailing, involving the presence of unwanted echo causing a bias shift voltage and leading to inaccuracies, such that the touch display may not operate smoothly or respond correctly. Therefore, an improved ultrasonic sensor capable of eliminating tailing signal is called for.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

FIG. 4C is a waveform diagram of an ultrasonic sensing device, in accordance with some embodiments of the present disclosure.

DETAILED DESCRIPTION

Figure 1A:
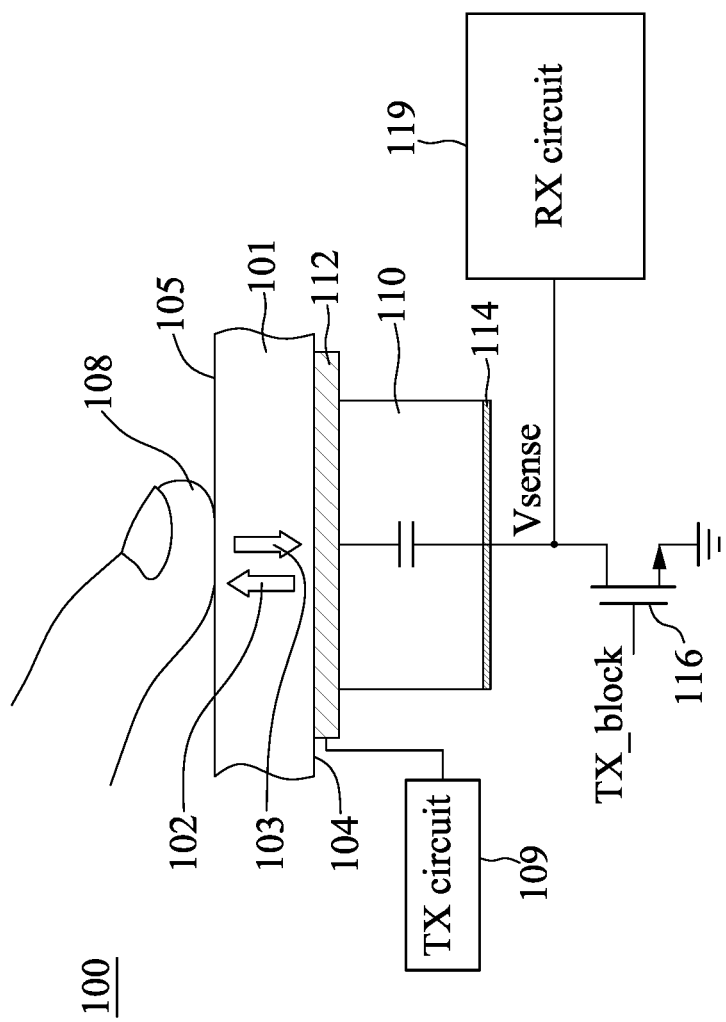
FIG. 1A is a schematic diagram of an ultrasonic sensing device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected to" or "coupled to" another element, it may be directly connected to or coupled to the other element, or intervening elements may be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1A is a schematic diagram of an ultrasonic sensing device 100, in accordance with some embodiments of the present disclosure. The ultrasonic sensing device 100 includes a substrate 101, a driver circuit (TX circuit) 109, a piezoelectric element 110, electrodes 112 and 114, a blocking transistor 116, and a receiving circuit (RX circuit) 119. A user's finger 108 can be placed on the substrate 101 during the operation of the ultrasonic sensing device 100.

In some embodiments, the ultrasonic sensing device 100 can be configured as an ultrasonic touch switch combined with a piezoelectric strain switch device. In some embodiments, the ultrasonic sensing device 100 can be a fingerprint sensor. The ultrasonic sensing device 100 can be included in a touch screen. In some embodiments, the touch screen can include one or more ultrasonic sensing devices 100. For example, an array of the ultrasonic devices 100 can be included in the touch screen, such that the activity of the full display can be detected.

The piezoelectric element 110 can be a piezoelectric polymer material, such as polyvinylidene fluoride (PVDF) or polyvinylidene fluoride-trifluoroethylene (PVDF-TrFE) in film form, or piezoelectric ceramic (PZT). In some embodiments, the piezoelectric element 110 has electrodes 112 and 114 disposed on opposing (top and bottom) surfaces of piezoelectric element 110. In one embodiment, the piezoelectric element 110 can include a capacitor. In some embodiments, the piezoelectric element 110 can be regarded as a capacitor storing charge. In this case, the electrodes 112 and 114 can be the electrodes of the capacitor.

The substrate 101 may be disposed on the piezoelectric element 110. The substrate can have a top surface 105 and a bottom surface 104 opposite to the top surface 105. The bottom surface 104 of the substrate 101 can be adjacent to the electrode 112 of the piezoelectric element 110. The substrate 101 can be connected to the piezoelectric element 110 through the electrode 112. In some embodiments, the substrate 101 can be formed of stainless steel or glass. A touch region (not shown) can be defined on the top surface 105 of the substrate 101. The top electrode 112 is bonded to the bottom surface 104 of the substrate 101 opposite from the touch region. In some embodiments, the touch region can be a computer-generated display region. In this case, the substrate 101, the piezoelectric element 110 and the electrodes 112 and 114 may be transparent.

In some embodiments, the driver circuit (TX circuit) 109 is configured to generate an ultrasonic signal 102. In some embodiments, the piezoelectric element 110 can be coupled with the driver circuit 109 through the electrode 112. The driver circuit 109 can excite the piezoelectric element 110 and the ultrasonic signal 102 can be launched into substrate 101. The ultrasonic signal 102 can be reflected at top surface 105 with an absorption by the user's finger 108, and then a reflected ultrasonic signal 103 is generated. The reflected ultrasonic signal 103 can be reflected back to bottom surface 104. In some embodiments, the piezoelectric element 110 can receive the reflected ultrasonic signal 103 in response to the ultrasonic signal 102.

The signal can propagate back and forth across the substrate 101. When the thickness of the substrate 101 is equal to an integer multiple of half wavelength condition of the substrate 101, resonance of substrate 101 takes place. When a finger is not present on the front surface 105 (i.e. there is nothing touched at the top surface 105 so that there is an air boundary for no finger touch condition), the resonance is strong and gives strong influence to impedance variation to the piezoelectric element 110. Impedance of the piezoelectric element 110 can vary due to contact of the finger or any other absorbing matter 108.

The receiving circuit (RX circuit) 119 can be connected to the electrode 114 of the piezoelectric element 110. In some embodiments, the RX circuit 119 can be configured to receive a signal Vsense generated by the piezoelectric element 110 in response to the reflected ultrasonic signal 103. The RX circuit 119 can detect the signal Vsense and output an output signal (control or switch signal) to other equipment or devices (not shown).

In some embodiments, the blocking transistor 116 can connect the electrode 114 of the piezoelectric element 110 to a fixed bias voltage (VSS). In one embodiment, the fixed bias voltage can be regarded as ground. The blocking transistor 116 can include a gate for receiving a blocking control signal TX_block, a drain electrically connected to the electrode 114 of the piezoelectric element 110, and a source electrically connected to the fixed bias voltage. In some embodiments, the drain of the blocking transistor 116 can receive the signal Vsense. In response to the blocking control signal TX_block, the blocking transistor 116 can be configured to turn on within a transmission period (TX period) and off during a receiving period (RX period).

Within the transmission period (TX period), the driver circuit 109 can be configured to generate the ultrasonic signal 102 into the substrate 101. When the ultrasonic signal 102 is launched into the substrate 101, the ultrasonic signal 102, which has high power, may also be transmitted to the piezoelectric element 110. In response to the high power ultrasonic signal 102, the signal Vsense generated by the piezoelectric element 110 can have higher power correspondingly. To avoid the RX circuit 119 being damaged by the high power signal Vsense, the blocking transistor 116 can be configured to turned on within the transmission period (TX period) so as to pass the high power signal Vsense to the fixed bias voltage (i.e., to the ground).

Within the receiving period (RX period), the blocking transistor 116 can be configured to turn off, such that the signal Vsense, which may have lower power, can be transmitted to the RX circuit 119. That is, during the receiving period, the RX circuit 119 can be configured to receive the signal Vsense in response to the reflected ultrasonic signal 103, and then output an output signal, in response to the signal Vsense, to control or switch other equipment or devices (not shown).

Figure 1B:
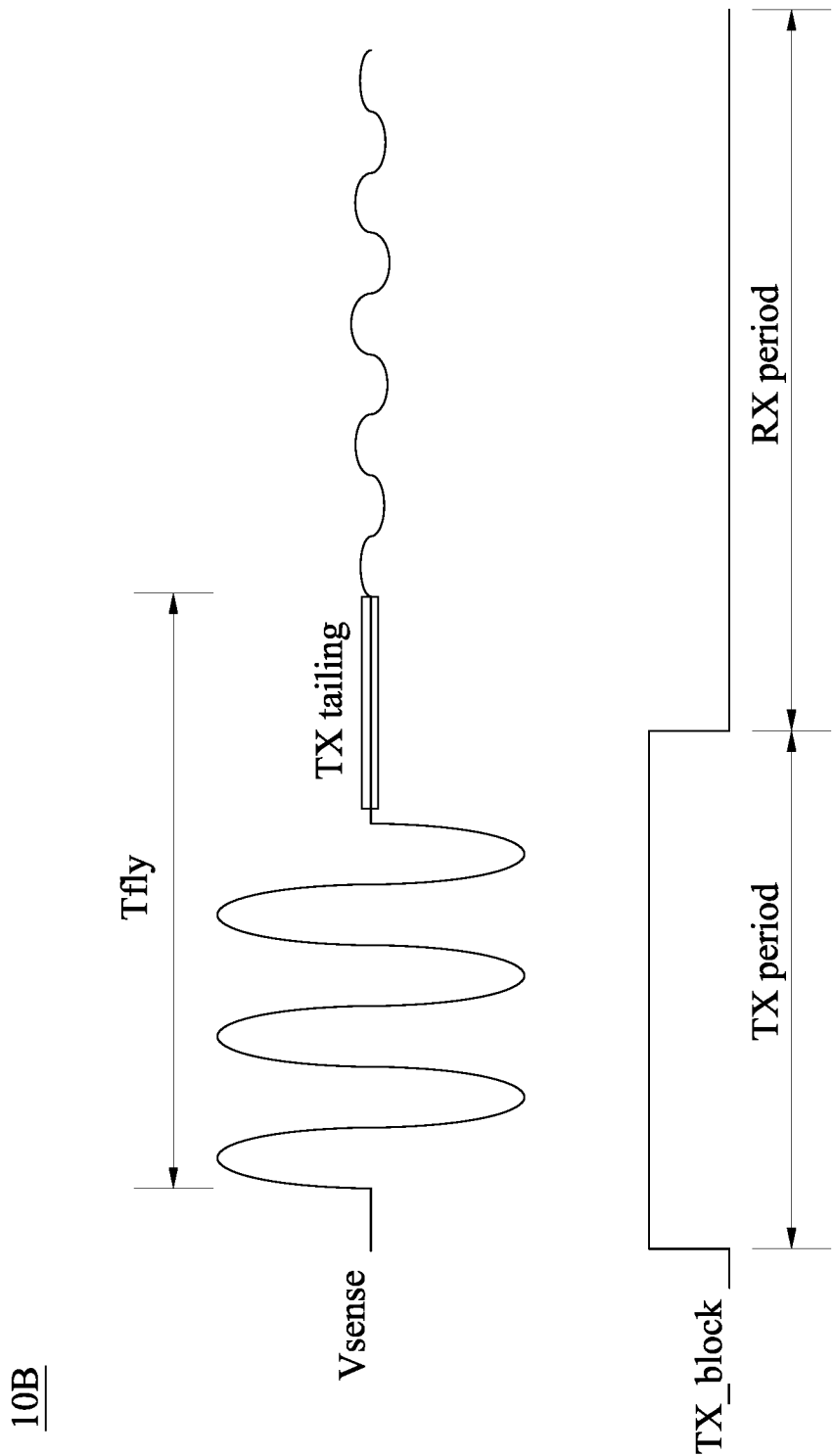
FIG. 1B is a waveform diagram of the ultrasonic sensing device depicted in FIG. 1A, in accordance with some embodiments of the present disclosure.

FIG. 1B is a waveform diagram 10B of the ultrasonic sensing device depicted in FIG. 1A, in accordance with some embodiments of the present disclosure. The waveform diagram 10B includes the blocking control signal TX_block received by the gate of the blocking transistor 116 (see FIG. 1A) and the signal Vsense monitored at the drain of the blocking transistor 116.

Referring to FIG. 1B, the blocking control signal TX_block can have a pulse. In some embodiments, the blocking control signal TX_block can be logic high at a transmission period TX. The blocking control signal TX_block can be logic low at a receiving period RX.

During the transmission period TX, the blocking transistor 116 can be configured to turn on. Meanwhile, the signal Vsense can have a great amplitude due to the high power ultrasonic signal 102 during transmission period TX. At the end of the transmission period TX, the signal 102 stops transmitting. In some embodiments, the signal Vsense can have a value of zero in response to the ultrasonic signal 102 ceasing at the end of the transmission period. After that, the reflected ultrasonic signal 103 can be received by the piezoelectric element 110.

During the receiving period RX, the blocking transistor 116 can be configured to turn off. In response to the reflected ultrasonic signal 103, the signal Vsense can have lower amplitude corresponding to the reflected ultrasonic signal 103. The flying time Tfly of the ultrasonic signal is a duration defined from the beginning of the first pulse of the signal Vsense in response to the ultrasonic signal 102 to the beginning of the first pulse of the signal Vsense in response to the reflected ultrasonic signal 103.

Generally, the signal Vsense would have a value of zero when the ultrasonic signal 102 stops transmitting. However, the signal Vsense may experience transmission tailing (TX tailing) (also called unwanted echo) at the end of the transmission of ultrasonic signal 102, in which a residual wave/signal remains after the signal stops transmitting. That is, the signal Vsense may have a value of non-zero when the ultrasonic signal 102 stops transmitting. Transmission tailing will occur between the end of the ultrasonic signal 102 and the beginning of the received reflected ultrasonic signal 103.

In some embodiments, the transmission tailing may lead to an unknown bias shift of the signal received by the receiving circuit 119 (as shown in FIG. 1A). That is, the received signal will no longer have zero bias. If the transmission tailing has a non-zero value (for example, a voltage of 1 mV) at the end of the blocking control signal TX_blocking, the later received signal will be shifted 1 mV. Details are discussed in FIG. 1C.

Figure 1C:
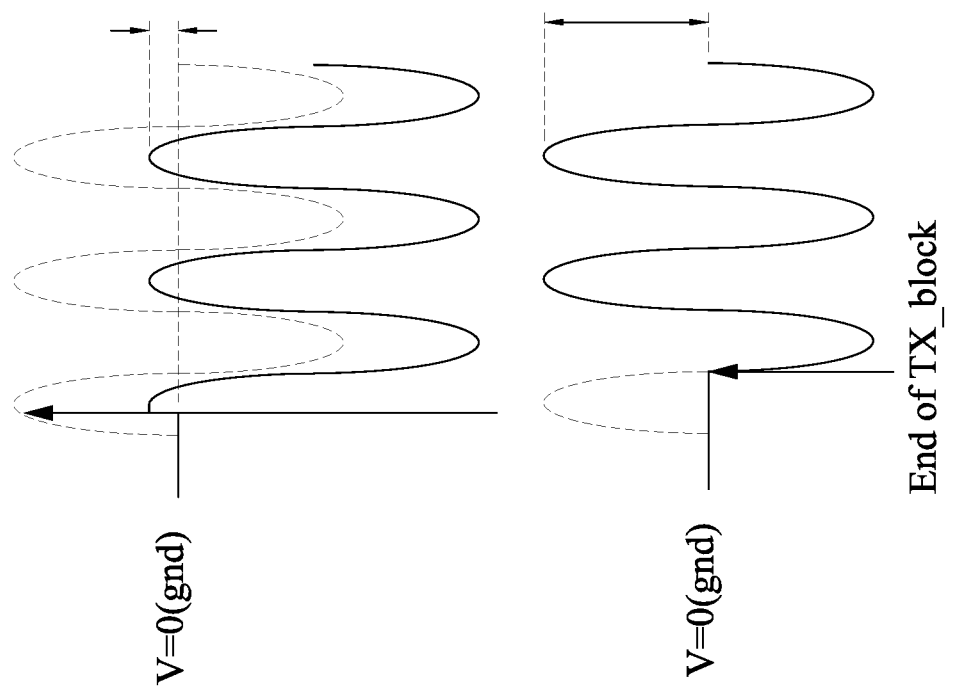
FIG. 1C is a waveform diagram of an ultrasonic sensing device depicted in FIG. 1A, in accordance with some embodiments of the present disclosure.

FIG. 1C is a waveform diagram 10C of an ultrasonic sensing device depicted in FIG. 1A, in accordance with some embodiments of the present disclosure. The waveform diagram 10C includes two types of waveforms of the signal received by the receiving circuit 119. In some embodiments, the signal received by the receiving circuit 119 can correspond to the signal Vsense, but with a shift due to transmission tailing. In some embodiments, the signal can be a sine wave.

In waveform diagram 10C, the lower waveform shows the ideal situation. In some embodiments, at the end of the blocking control signal TX_block, the signal exactly swings to a value of zero. In this case, when the receiving circuit 119 starts to receive the signal Vsense, the signal received by the receiving circuit 119 will fully correspond to the reflected ultrasonic signal 103, without shifting. That is, the received signal can correspond to the reflected ultrasonic signal 103 without shifting.

In waveform diagram 10C, the upper waveform shows the effect of transmission tailing. In some embodiments, at the end of the blocking control signal TX_block, the signal swings to a non-zero value. In this case, when the receiving circuit 119 starts to receive the signal Vsense, the received signal may correspond to the reflected ultrasonic signal 103 with an unknown shift. That is, the received signal may correspond to the reflected ultrasonic signal 103 with shifting. The bias shift leads to errors when measuring the peak value of each pulse, such that the output signal of the receiving circuit 119 may be inaccurate. The present disclosure provides an improved ultrasonic sensing device capable of detecting the signal Vsense accurately.

FIGS. 2A, 2B, 2C, 2D, 2E, 2F, 2G, 2H, and 2I are concept diagrams of each operation of a bias shift eliminator of an ultrasonic sensor circuit, in accordance with some embodiments of the present disclosure, proposing an application to the embodiments of the present disclosure. In some embodiments, the operations of a bias shift eliminator of an ultrasonic sensor circuit as shown in FIGS. 2A, 2B, 2C, 2D, 2E, 2F, 2G, 2H, and 2I can be performed during the receiving period RX, rather than transmission period (TX period).

Figure 2A:
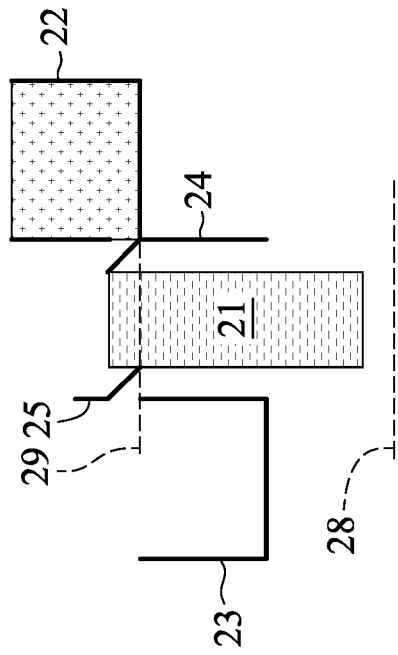
FIGS. 2A, 2B, 2C, 2D, 2E, 2F, 2G, 2H, and 2I show operations of a stabilizer of an ultrasonic sensor circuit, in accordance with some embodiments of the present disclosure.

FIG. 2A shows an initial state. FIG. 2A includes a capacitor 21, a source element 22, a sink element 23, a source sense gate 24, and a sink sense gate 25. The capacitor 21 can correspond to the piezoelectric element 110 shown in FIG. 1A. The proposed concept is to record the ramp-up and ramp-down of charge of the capacitor 21, in response to the received ultrasonic signal (for example, a sine wave). The capacitor 21 can have an upper potential 29 and a lower potential 28. In some embodiments, the upper potential 29 and the lower potential 28 can be regarded as the two electrodes of the capacitor 21. The distance between the upper potential 29 and the lower potential 28 can be the capacitance value of the capacitor 21.

In some embodiments, the source element 22 can provide the required charge for the capacitor 21. The source sense gate 24 can be turned on or off to allow the electrical charge of the source element 22 to pass to the capacitor 21. Alternatively, the sink element 23 can receive the excess electrical charge of the capacitor 21. The sink sense gate 25 can be turned on or off to allow the excess electrical charge of the capacitor 21 to pass to the sink element 23.

In the initial state, the source element 22 can be fully charged, and the sink element 23 can be clear (empty).

Figure 2B:
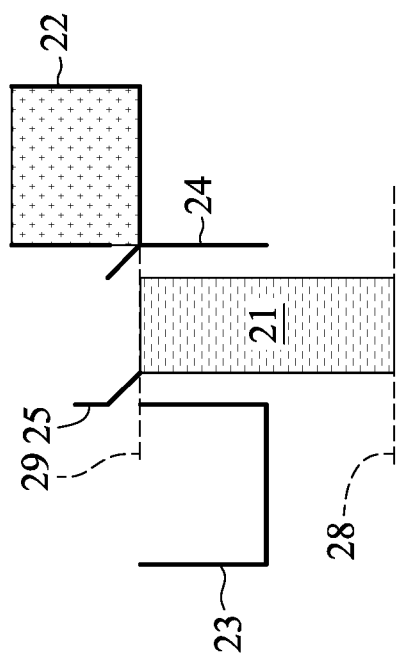

FIG. 2B shows the charge of the capacitor 21 increasing in response to the received ultrasonic signal. In some embodiments, the charge of the capacitor 21 may exceed the upper potential 29.

Figure 2C:
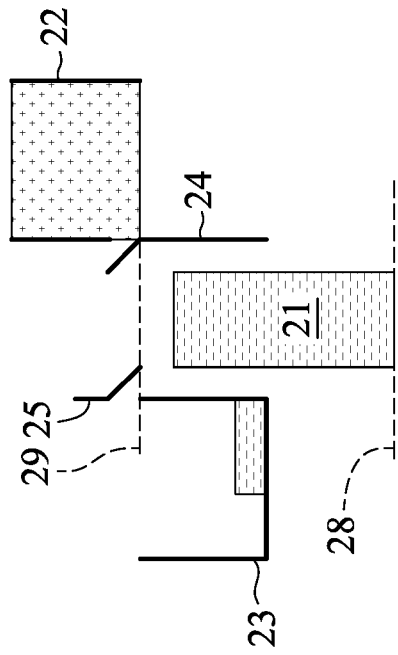

FIG. 2C shows that the sink sense gate 25 can be turned on so that the electrical charge exceeding the upper potential 29 can be passed to the sink element 23. Accordingly, the excess electrical charge due to ramp-up of the ultrasonic signal can be recorded in the sink element 23.

Figure 2D:
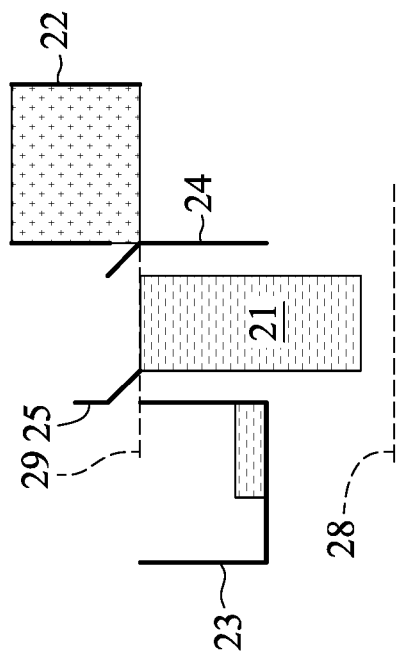

FIG. 2D shows that the charge of the capacitor 21 decreases in response to the received ultrasonic signal. In other words, the charge of the capacitor 21 may decrease. In some embodiments, the charge of the capacitor 21 cannot achieve the upper potential 29.

Figure 2E:
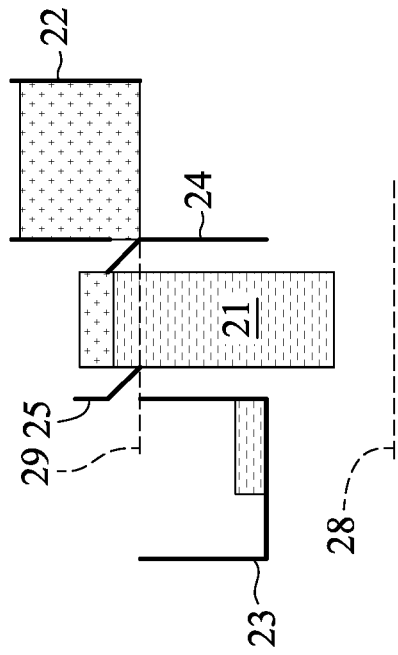

FIG. 2E shows that the source sense gate 24 can be turned on so that the empty charge less than the upper potential 29 of the capacitor 21 can be fulfilled by the charge of the source element 22. Accordingly, the empty charge due to ramp-down of the ultrasonic signal can be passed to the capacitor 21 from the source element 22.

Figure 2F:
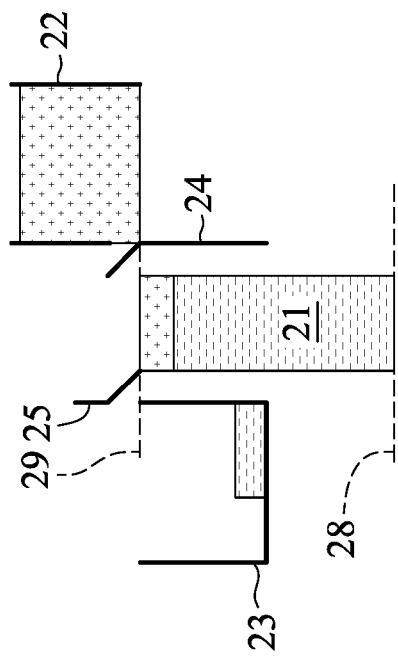

FIG. 2F shows that the charge of the capacitor 21 goes up in response to the received ultrasonic signal. In some embodiments, the charge of the capacitor 21 may exceed the upper potential 29.

Figure 2G:
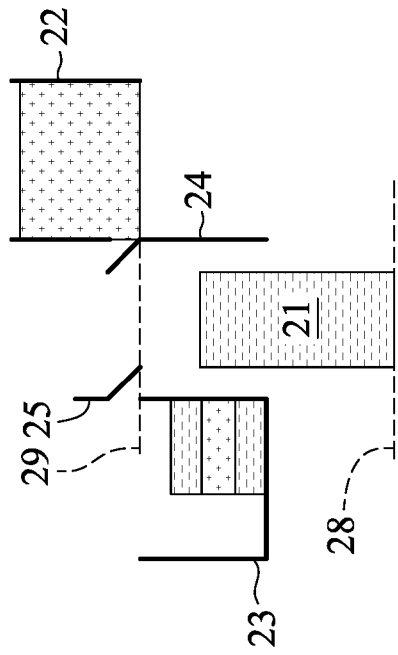

FIG. 2G shows that the sink sense gate 25 can be turned on so that the charge exceeding the upper potential 29 can be passed to the sink element 23. Accordingly, the excess electrical charge due to ramp-up of the ultrasonic signal can be passed to the sink element 23. In some embodiments, the charge passed to the sink element 23 can include the original charge stored in the capacitor 21 and the charge obtained from the source element 22. In some embodiments, the charge passed to the sink element 23 can be more than that in FIG. 2C.

Figure 2H:
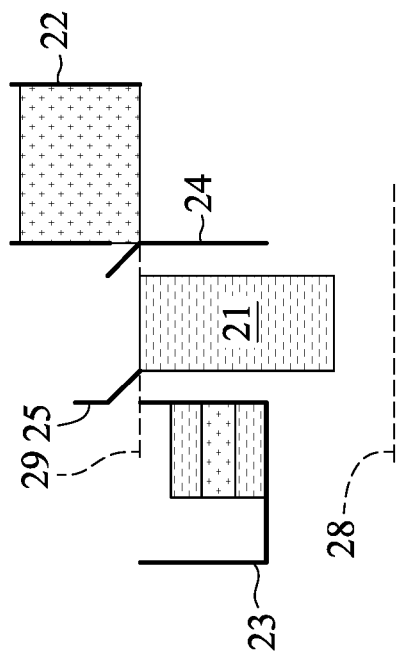

FIG. 2H shows that the charge of the capacitor 21 decreases in response to the received ultrasonic signal. In other words, the charge of the capacitor 21 may decrease. In some embodiments, the charge of the capacitor 21 cannot achieve the upper potential 29. In some embodiments, the empty charge less than the upper potential 29 can be more than the empty charge in FIG. 2D.

Figure 2I:
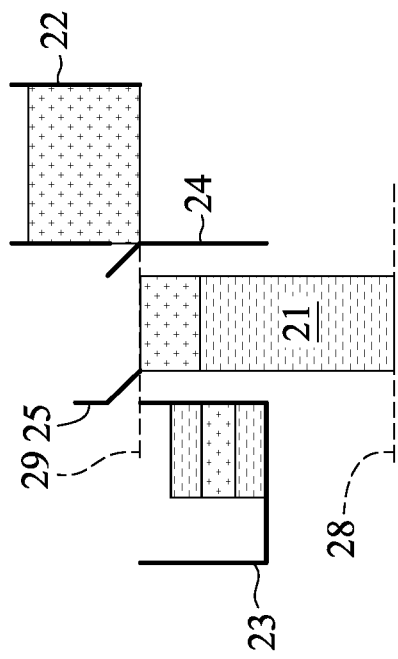

FIG. 2I shows that the source sense gate 24 can be turned on so that the empty charge less than the upper potential 29 of the capacitor 21 can be fulfilled by the charge of the source element 22. Accordingly, the empty charge due to ramp-down of the ultrasonic signal can be passed to the capacitor 21 from the source element 22.

Utilizing the method illustrated in FIGS. 2A, 2B, 2C, 2D, 2E, 2F, 2G, 2H, and 2I, the capacitor 21 can be maintained in a constant voltage. In addition, the ramp-up and ramp-down charge corresponding to the wave of the ultrasonic signal can be monitored and recorded, so that the bias shift due to transmission tailing can be eliminated.

In some embodiments, the source element 22 and the sink element 23 can be an integrator, a capacitor, or a charge storage device. In some embodiments, the source sense gate 24 and the sink sense gate 25 can be a rectifier.

Figure 3A:
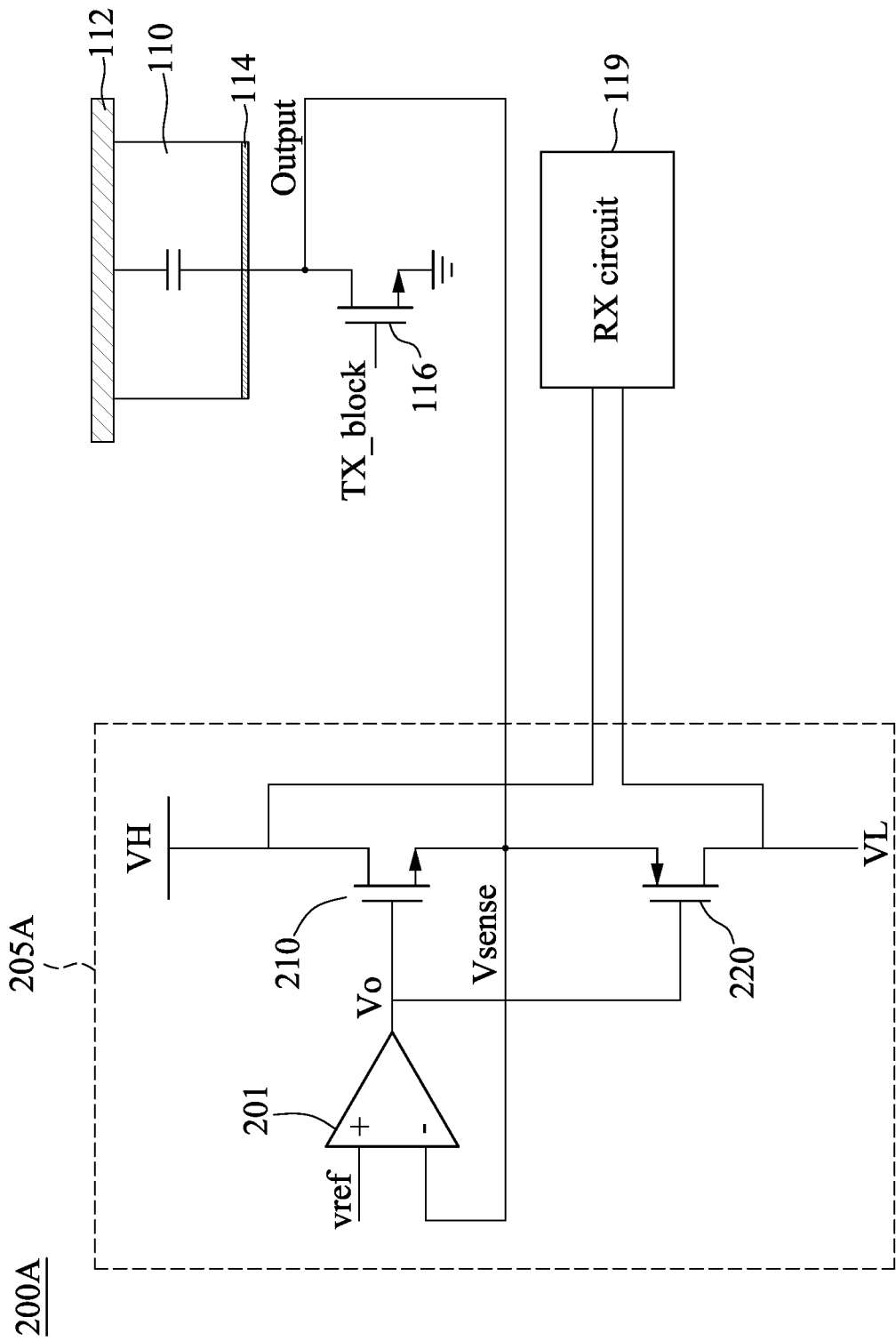
FIG. 3A is a schematic diagram of an ultrasonic sensing device, in accordance with some embodiments of the present disclosure.

FIG. 3A is a schematic diagram of an ultrasonic sensing device 200A, in accordance with some embodiments of the present disclosure. The ultrasonic sensing device 200A includes a piezoelectric element 110, a blocking transistor 116, a receiving circuit 119, an amplifier 201, a source rectifier 210, and a sink rectifier 220. For simplicity, details regarding the piezoelectric element 110, the blocking transistor 116, and the receiving circuit 119, already discussed in accordance with FIG. 1A, are not repeated again.

The elements connected to the node between the blocking transistor 116 and the receiving circuit 119 can be referred to as a bias shift eliminator 205A. The bias shift eliminator 205A can include the amplifier 201, a source rectifier 210, and a sink rectifier 220. The bias shift eliminator 205A can remove the bias shift of the signal Vsense, such that the receiving circuit 119 can determine the signal Vsense accurately.

In some embodiments, the source rectifier 210 can be a transistor, for example, an NMOS. The source rectifier 210 can include a gate, a drain, and a source. The drain of the source rectifier 210 can be configured to receive a higher fixed voltage VH. In some embodiments, the drain of the source rectifier 210 can be coupled to the power supply (VDD) through one or more electronic components (not shown). In some embodiments, the higher fixed voltage can be provided by a charge storage device, such as a capacitor or an integrator. The source of the source rectifier 210 can be connected to the piezoelectric element 110. The source of the source rectifier 210 can be connected to the blocking transistor 116. In some embodiments, the drain of the source rectifier 210 can be connected to the receiving circuit 119.

The sink rectifier 220 can be a transistor, for example, a PMOS. The sink rectifier 220 can include a gate, a drain, and a source. The drain of the sink rectifier 220 can be configured to receive a lower fixed voltage VL. In some embodiments, the drain of the sink rectifier 220 can be coupled to the ground through one or more electronic components (not shown). In some embodiments, the lower fixed voltage can be provided by a charge storage device, such as a capacitor or an integrator. The source of the sink rectifier 220 can be connected to the piezoelectric element 110. The source of the sink rectifier 220 can be connected to the blocking transistor 116. In some embodiments, the drain of the sink rectifier 220 can be connected to the receiving circuit 119. The gate of the sink rectifier 220 can be electrically connected to the gate of the source rectifier 210.

In some embodiments, the receiving circuit 119 can have two terminals. One terminal of the receiving circuit 119 can be connected to the drain of the source rectifier 210. Another terminal of the receiving circuit 119 can be connected to the drain of the sink rectifier 220.

In some embodiments, the source rectifier 210 and the sink rectifier 220 can be operated in saturation region. Under the saturation region, the source rectifier 210 and the sink rectifier 220 can be turned on and have a unidirectional current flow. For example, the source rectifier 210 can have a unidirectional conductive path from the drain to the source thereof in the saturation region. The sink rectifier 220 can have a unidirectional conductive path from the source to the drain thereof in the saturation region. In some embodiments, the current through the source rectifier 210 or the sink rectifier 220 can have no direct current (DC) components connected thereto. When the source rectifier 210 or the sink rectifier 220 is under saturation region, the current can pass through the source rectifier 210 or the sink rectifier 220, and then be integrated as wanted signals (i.e., deriving the signal Vsense).

In some embodiments, there would exist a dead zone in which no signal will be detected by the ultrasonic sensing device 200A. In some embodiments, the dead zone can be determined by the source rectifier 210 and the sink rectifier 220. The dead zone of the ultrasonic sensing device 200A can be calculated as Eq. 1:

$$V_{dead-zone} = \frac{V_{thp} + V_{thn}}{A_{amp}} \quad [\text{Eq. 1}]$$

In Eq. 1, $V_{dead-zone}$ represents the voltage range of the dead zone; $V_{thp}$ represents the threshold voltage Vgs of PMOS (i.e., the sink rectifier 220); $V_{thn}$ represents the threshold voltage Vgs of NMOS (i.e., the source rectifier 210), and $A_{amp}$ represents the gain of the amplifier 201. The greater $V_{dead-zone}$ indicates that more parts of the signal Vsense cannot be detected and determined. In other words, the $V_{dead-zone}$ can be as small as possible according to needs.

Referring to FIG. 3A, the amplifier 201 can include a negative input terminal, a positive input terminal, and an output terminal. The positive input terminal of amplifier 201 can be configured to receive a reference signal Vref. In some embodiments, the negative input terminal of the amplifier 201 can be connected to the source of the source rectifier 210. The negative input terminal of the amplifier 201 can be connected to the source of the sink rectifier 220. The output terminal of amplifier 201 can be connected to the gate of the source rectifier 210. The output terminal of amplifier 201 can be connected to the gate of the sink rectifier 220. In some embodiments, the amplifier 201 can easily control the source rectifier 210 and the sink rectifier 220 to be in the saturation region under this configuration.

In some embodiments, the signal Vsense can be transmitted to the negative input terminal of the amplifier 201. The amplifier 201 can be configured to compare the signal Vsense and the reference signal Vref. The amplifier 201 can output an output signal Vo to the gate of the source rectifier 210 and the gate of the sink rectifier 220 in response to the comparison of the signal Vsense and the reference signal Vref.

Once the signal Vsense exceeds the reference signal Vref, indicating that the signal Vsense has a positive bias shift, the source rectifier 210 can be configured to turn off and the sink rectifier 220 can be configured to turn on in response to the output signal Vo of the amplifier 201. In this case, the charge of the signal Vsense exceeding the reference signal Vref passes through the sink rectifier 220. Alternatively, when the signal Vsense is less than the reference signal Vref, indicating that the signal Vsense has a negative bias shift, the source rectifier 210 can be configured to turn on and the sink rectifier 220 can be configured to turn off in response to the output signal Vo of the amplifier 201. In this case, the charge gap of the signal Vsense less than the reference signal Vref would be fulfilled through the source rectifier 210. Accordingly, the signal Vsense can be maintained at a nominal voltage level.

Figure 3B:
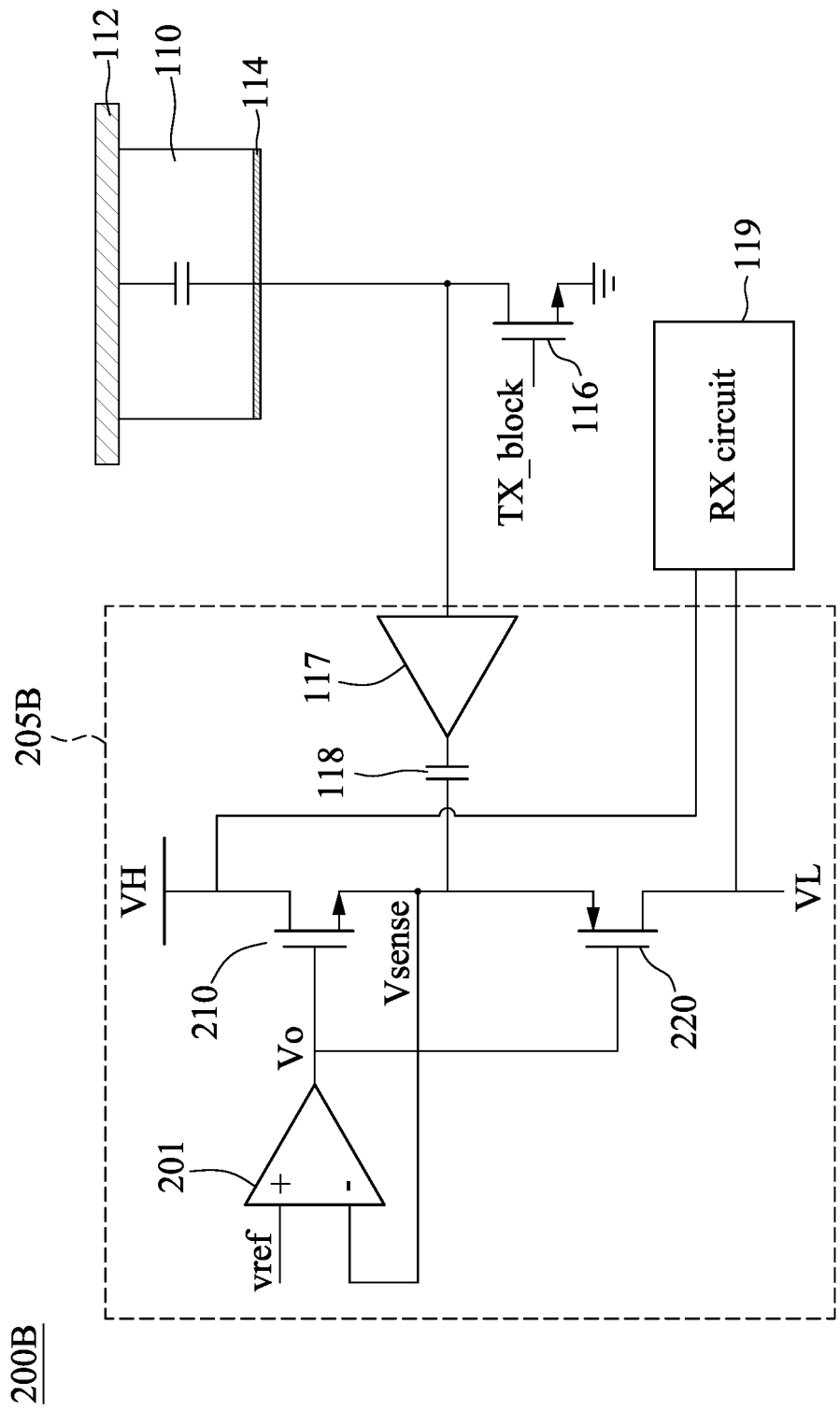
FIG. 3B is a schematic diagram of an ultrasonic sensing device, in accordance with some embodiments of the present disclosure.

FIG. 3B is a schematic diagram of an ultrasonic sensing device 200B, in accordance with some embodiments of the present disclosure. The ultrasonic sensing device 200B includes a piezoelectric element 110, a blocking transistor 116, a receiving circuit 119, an amplifier 201, a source rectifier 210, a sink rectifier 220, a buffer 117, and a capacitor 118. Referring to FIG. 3B, the ultrasonic sensing device 200B in FIG. 3B is similar to the ultrasonic sensing device 200A in FIG. 3A, differing therefrom in that in FIG. 3B, the bias shift eliminator 205B further includes the buffer 117 and the capacitor 118 connected between the piezoelectric element 110 and the source of the source rectifier 210.

In some embodiments, the buffer 117 can include an input terminal and an output terminal. The input terminal of the buffer 117 can be connected to the electrode 114 of the piezoelectric element 110. In some embodiments, the input terminal of the buffer 117 can be connected to the drain of the blocking transistor 116. The input terminal of the buffer 117 can be connected to a node between the electrode 114 of the piezoelectric element 110 and the drain of the blocking transistor 116. The output terminal of the buffer 117 can be coupled to the negative input terminal of the amplifier 201. The output terminal of the buffer 117 can be coupled to the source of the source rectifier 210 and the source of the sink rectifier 220. In some embodiments, the output terminal of the buffer 117 can be coupled to the source of the source rectifier 210.

The buffer 117 can be a buffer amplifier. The buffer 117 can provide electrical impedance transformation from one circuit to another. In some embodiments, the buffer 117 can be a voltage buffer or a current buffer. The type of the buffer 117 is not limited.

The capacitor 118 can be connected to the output terminal of the buffer 117. The capacitor 118 can be connected to the source of the source rectifier 210 and the source of the sink rectifier 220. The capacitor 118 can be connected to the negative input terminal of the amplifier 201. In some embodiments, the capacitor 118 can be connected between the output terminal of the buffer 117 and the source of the source rectifier 210. In some embodiments, the value of the capacitor 118 can be selected according to need.

In some embodiments, the ultrasonic sensing device includes the buffer 117 and/or the capacitor 118 providing a buffer, and thus can also be applicable on the ultrasonic signal having a short flying time Tfly.

Figure 3C:
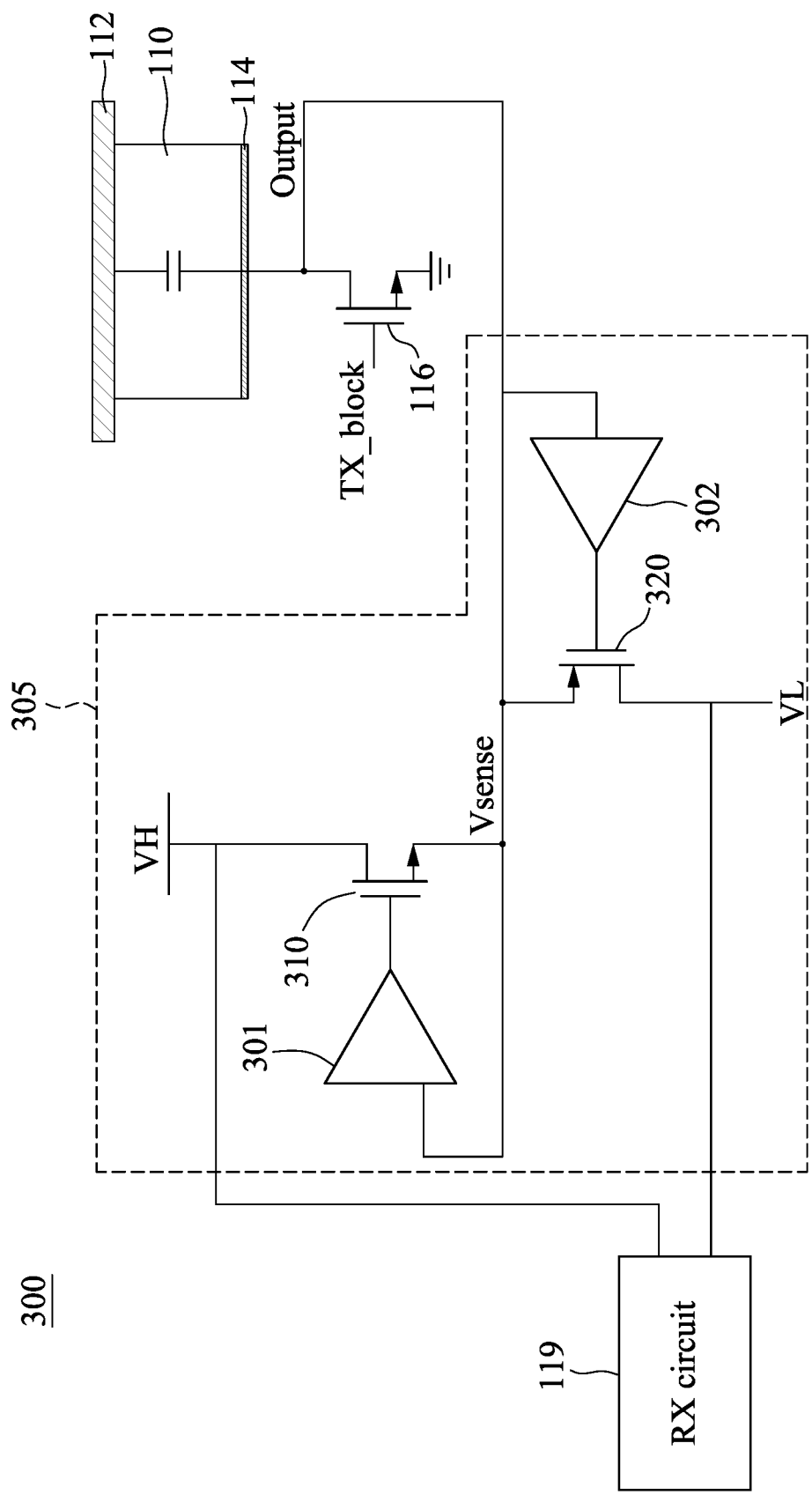
FIG. 3C is a schematic diagram of an ultrasonic sensing device, in accordance with some embodiments of the present disclosure.

FIG. 3C is a schematic diagram of an ultrasonic sensing device 300, in accordance with some embodiments of the present disclosure. The ultrasonic sensing device 300 includes a piezoelectric element 110, a blocking transistor 116, a receiving circuit 119, amplifiers 301 and 302, a source rectifier 310, and a sink rectifier 320. Referring to FIG. 3C, the ultrasonic sensing device 300 in FIG. 3C is similar to the ultrasonic sensing device 200A in FIG. 3A, differing therefrom in that in FIG. 3C, the bias shift eliminator 305 includes two amplifiers 301 and 302. The amplifiers 301 and 302 are similar to the amplifier 201 in FIG. 3A, differing therefrom in that the amplifiers 301 and 302 are simplified the positive input terminal for receiving the reference signal.

Referring to FIG. 3C, the amplifier 301 can include an input terminal and an output terminal. In some embodiments, the input terminal of the amplifier 301 can be connected to the source of the source rectifier 310. The input terminal of the amplifier 301 can be connected to the source of the sink rectifier 320. The output terminal of amplifier 301 can be connected to the gate of the source rectifier 310.

In some embodiments, the signal Vsense can be transmitted to the input terminal of the amplifier 301. The amplifier 301 can be configured to compare the signal Vsense and a reference signal. The amplifier 301 can output an output signal to the gate of the source rectifier 310 in response to the comparison of the signal Vsense and the reference signal. Accordingly, the source rectifier 310 can be configured to turn on or off in response to the output signal of the amplifier 301.

The amplifier 302 can include an input terminal and an output terminal. In some embodiments, the input terminal of the amplifier 302 can be connected to the source of the source rectifier 310. The input terminal of the amplifier 302 can be connected to the source of the sink rectifier 320. The output terminal of amplifier 301 can be connected to the gate of the sink rectifier 320.

In some embodiments, the signal Vsense can be transmitted to the input terminal of the amplifier 302. The amplifier 302 can be configured to compare the signal Vsense and a reference signal. The amplifier 302 can output an output signal to the gate of the sink rectifier 320 in response to the comparison of the signal Vsense and the reference signal. Accordingly, the sink rectifier 320 can be configured to turn on or off in response to the output signal of the amplifier 302.

Figure 4A:
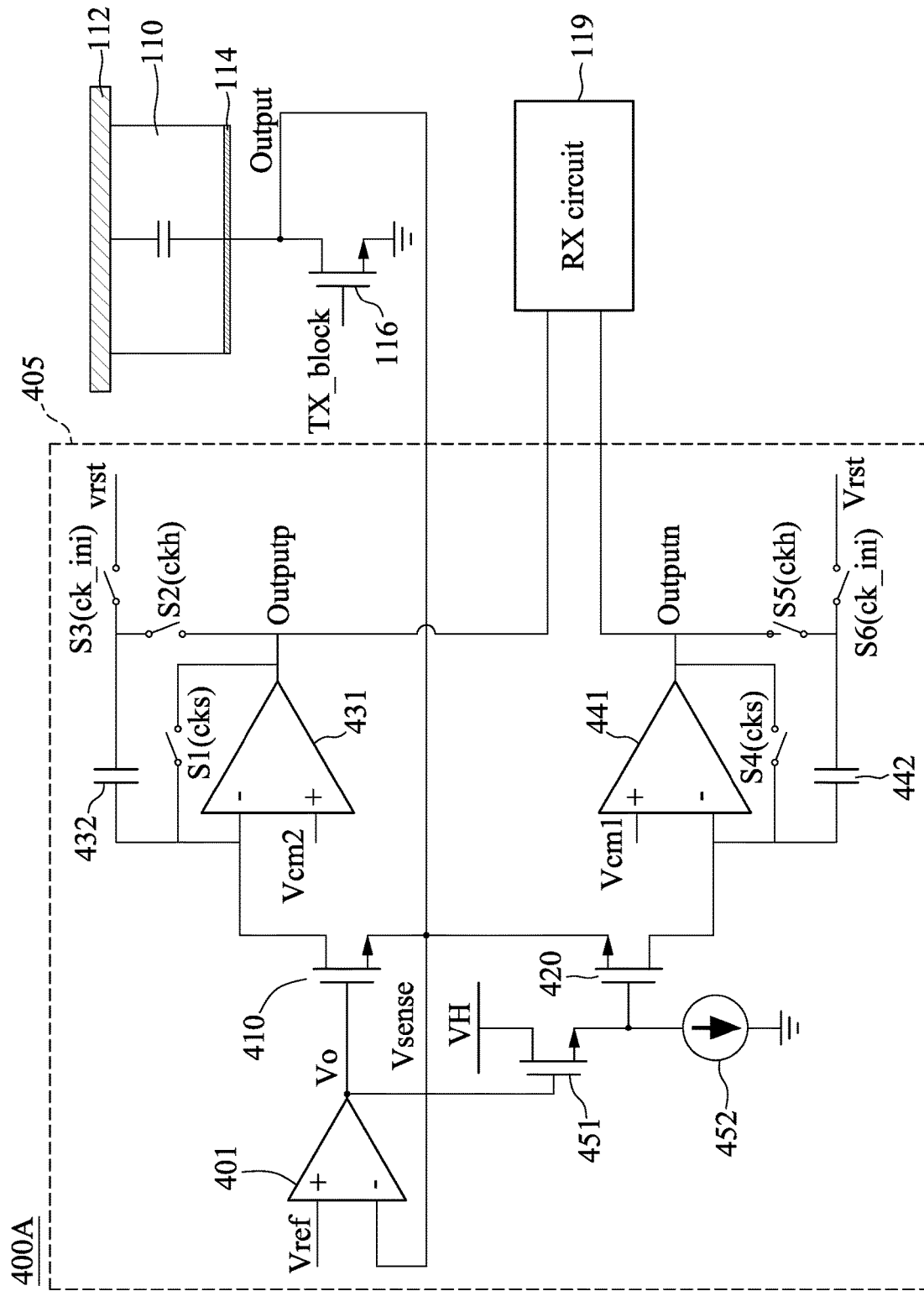
FIG. 4A is a schematic diagram of an ultrasonic sensing device, in accordance with some embodiments of the present disclosure.

FIG. 4A is a schematic diagram of an ultrasonic sensing device 400A, in accordance with some embodiments of the present disclosure. The ultrasonic sensing device 400A includes a piezoelectric element 110, a blocking transistor 116, a receiving circuit 119, an amplifier 401, a source amplifier 431, a sink amplifier 441, a source rectifier 410, a sink rectifier 420, a source capacitor 432, a sink capacitor 442, a transistor 451, and a current source 452. Referring to FIG. 4A, the ultrasonic sensing device 400A in FIG. 4A is similar to the ultrasonic sensing device 200A in FIG. 3A, differing therefrom in that in FIG. 4A, the bias shift eliminator 405 includes the amplifier 401, the source amplifier 431, the sink amplifier 441, the source rectifier 410, the sink rectifier 420, the source capacitor 432, the sink capacitor 442, the transistor 451, and the current source 452.

In some embodiments, the amplifier 401 can include a negative input terminal, a positive input terminal, and an output terminal. The positive input terminal of amplifier 401 can be configured to receive a reference signal Vref. In some embodiments, the negative input terminal of the amplifier 401 can be connected to the source of the source rectifier 410. The negative input terminal of the amplifier 401 can be connected to the source of the sink rectifier 420. The negative input terminal of the amplifier 401 can be connected to the piezoelectric element 110. The output terminal of amplifier 401 can be connected to the gate of the source rectifier 410. The output terminal of amplifier 401 can be connected to the gate of the sink rectifier 420.

In some embodiments, the signal Vsense can be transmitted to the negative input terminal of the amplifier 401. The amplifier 401 can be configured to compare the signal Vsense and the reference signal Vref. The amplifier 401 can output an output signal Vo to the gate of the source rectifier 410 and the gate of the sink rectifier 420 in response to the comparison of the signal Vsense and the reference signal. Accordingly, the source rectifier 410 and the sink rectifier 420 can be configured to turn on or off in response to the output signal Vo of the amplifier 401.

The source portion of the bias shift eliminator 405 may include the source rectifier 410, the source amplifier 431, and the source capacitor 432. In some embodiments, the source rectifier 410 can be an NMOS. The source rectifier 410 can include a gate, a drain, and a source. The drain of the source rectifier 410 can be connected to a charge storage device, such as a capacitor or an integrator. The source of the source rectifier 410 can be connected to the piezoelectric element 110. The source of the source rectifier 410 can be connected to the blocking transistor 116. The gate of the source rectifier 410 can be connected to the output terminal of the amplifier 401.

The source amplifier 431 can include a positive input terminal, a negative input terminal, and an output terminal. The positive input terminal of the source amplifier 431 can be configured to receive a reference signal Vcm2. In some embodiments, the negative input terminal of the source amplifier 431 can be connected to the drain of the source rectifier 410. The output terminal of source amplifier 431 can be connected to the receiving circuit 119. In some embodiments, the output terminal of the source amplifier 431 can be connected to the negative input terminal of the source amplifier 431 through a switch S1. In some embodiments, the switch S1 can be controlled by a signal cks.

In some embodiments, the source capacitor 432 can be connected to the drain of the source rectifier 410. The source capacitor 432 can be connected to the negative input terminal of the source amplifier 431. The source capacitor 432 can be connected to the output terminal of the source amplifier 431 through the switch S1.

The source capacitor 432 can be configured to receive a reset signal Vrst through a switch S3. In some embodiments, the switch S3 can be controlled by a signal ck_ini. In some embodiments, the source capacitor 432 can be connected to the output terminal of the source amplifier 431 through a switch S2. In some embodiments, the switch S2 can be controlled by a signal ckh. In some embodiments, the source capacitor 432 can be connected to the receiving circuit 119 through the switch S2.

In some embodiments, the configuration of the source amplifier 431 and the source capacitor 432 can be a source integrator. In some embodiments, the source integrator can output a source output signal Outputp.

The sink portion of the bias shift eliminator 405 may include the sink rectifier 420, the sink amplifier 441, the sink capacitor 442, the transistor 451, and the current source 452. In some embodiments, the sink rectifier 420 can be a PMOS. The sink rectifier 420 can include a gate, a drain, and a source. The drain of the sink rectifier 420 can be connected to a charge storage device, such as a capacitor or an integrator. The source of the sink rectifier 420 can be connected to the piezoelectric element 110. The source of the sink rectifier 420 can be connected to the blocking transistor 116. The gate of the sink rectifier 420 can be coupled to the output terminal of the amplifier 401.

The sink amplifier 441 can include a positive input terminal, a negative input terminal, and an output terminal. The positive input terminal of the sink amplifier 441 can be configured to receive a reference signal Vcm1. In some embodiments, the negative input terminal of the sink amplifier 441 can be connected to the drain of the sink rectifier 420. The output terminal of sink amplifier 441 can be connected to the receiving circuit 119. In some embodiments, the output terminal of the sink amplifier 441 can be connected to the negative input terminal of the sink amplifier 441 through a switch S4. In some embodiments, the switch S4 can be controlled by the signal cks.

In some embodiments, the sink capacitor 442 can be connected to the drain of the sink rectifier 420. The sink capacitor 442 can be connected to the negative input terminal of the sink amplifier 441. The sink capacitor 442 can be connected to the output terminal of the sink amplifier 441 through the switch S4.

The sink capacitor 442 can be configured to receive the reset signal Vrst through a switch S6. In some embodiments, the switch S6 can be controlled by the signal ck_ini. In some embodiments, the sink capacitor 442 can be connected to the output terminal of the sink amplifier 441 through a switch S5. In some embodiments, the switch S5 can be controlled by a signal ckh. In some embodiments, the sink capacitor 442 can be connected to the receiving circuit 119 through the switch S5.

In some embodiments, the configuration of the sink amplifier 441 and the sink capacitor 442 can be a sink integrator. In some embodiments, the sink integrator can output a sink output signal Outputn.

In some embodiments, the transistor 451 can include a gate, a drain, and a source. The transistor 451 can be a PMOS. The gate of the transistor 451 can be connected to the output terminal of the amplifier 401. In some embodiments, the gate of the transistor 451 can be connected to the source of the source rectifier 410. The drain of the transistor 451 can be configured to receive a higher fixed voltage VH. In some embodiments, the higher fixed voltage can be a charge storage device, such as a capacitor or an integrator. The source of the transistor 451 can be connected to the gate of the sink rectifier 420.

The source amplifier 401 can output the output signal Vo to the gate of the transistor 451. The transistor 451 can be configured to turn on or off in response to the output signal Vo of the amplifier 401. When the transistor 451 is turned on, the gate of the sink rectifier 420 can be configured to receive a signal, such that the sink rectifier 420 can be configured to turn on or off.

The current source 452 can be connected to the source of the transistor 451 and the gate of the sink rectifier 420. In some embodiments, the current source 452 can be connected to the lower fixed voltage. The current source 452 and the transistor 451 can increase the accuracy of the bias shift eliminator 405 of the ultrasonic sensing device 400A.

Differing from FIG. 3A, in which the gate of the source rectifier 210 is directly connected to the gate of the sink rectifier 220, the ultrasonic sensing device 400A further includes the transistor 451 between the gate of the source rectifier 410 and the gate of the sink rectifier 420. In this case, the $V_{dead-zone}$ of the ultrasonic sensing device 400A can be less than that of the ultrasonic sensing device 200A in FIG. 3A. In some embodiments, the dead zone can be determined by the source rectifier 410, the sink rectifier 420, and the transistor 451. The dead zone of the ultrasonic sensing device 400A can be calculated as Eq. 2:

$$V_{dead-zone} = \frac{V_{thp} + V_{thn} - V_{thn} - V_{dsat}}{A_{amp}} = \frac{V_{thp} - V_{dsat}}{A_{amp}}, \quad [\text{Eq. 2}]$$

In Eq. 2, $V_{dead-zone}$ represents the voltage range of the dead zone; $V_{thp}$ represents the threshold voltage Vth of PMOS (i.e., the sink rectifier 220); $V_{thn}$ represents the threshold voltage Vth of NMOS (i.e., the source rectifier 210); $V_{dsat}$ represents the saturation drain voltage of PMOS/NMOS, which is the minimum voltage required for keeping the transistor in saturation region, and $A_{amp}$ represents the gain of the amplifier 401.

In some embodiments, a source output signal Outputp can be obtained at the output terminal of the source amplifier 431. A sink output signal Outputn can be obtained at the output terminal of the sink amplifier 441. In some embodiments, the source output signal Outputp and the sink output signal Outputn can be transmitted to the receiving circuit 119, such that the actual signal Vsense can be determined by the receiving circuit 119 without bias shift. In some embodiments, the receiving circuit 119 can include an analog-to-digital converter (ADC) to process the source output signal Outputp and the sink output signal Outputn so as to obtain the signal Vsense.

In some embodiments, the drain of the source rectifier 410 connected to the negative input terminal of the amplifier 431 is a floating node the voltage of which is set by the capacitor 432 and the amplifier 431, such that flicker noise of the source integrator is suppressed. Similarly, the drain of the sink rectifier 420 connected to the negative input terminal of the amplifier 441 is a floating node the voltage of which is set by the capacitor 442 and the amplifier 441, such that flicker noise of the sink integrator is suppressed.

Figure 4B:
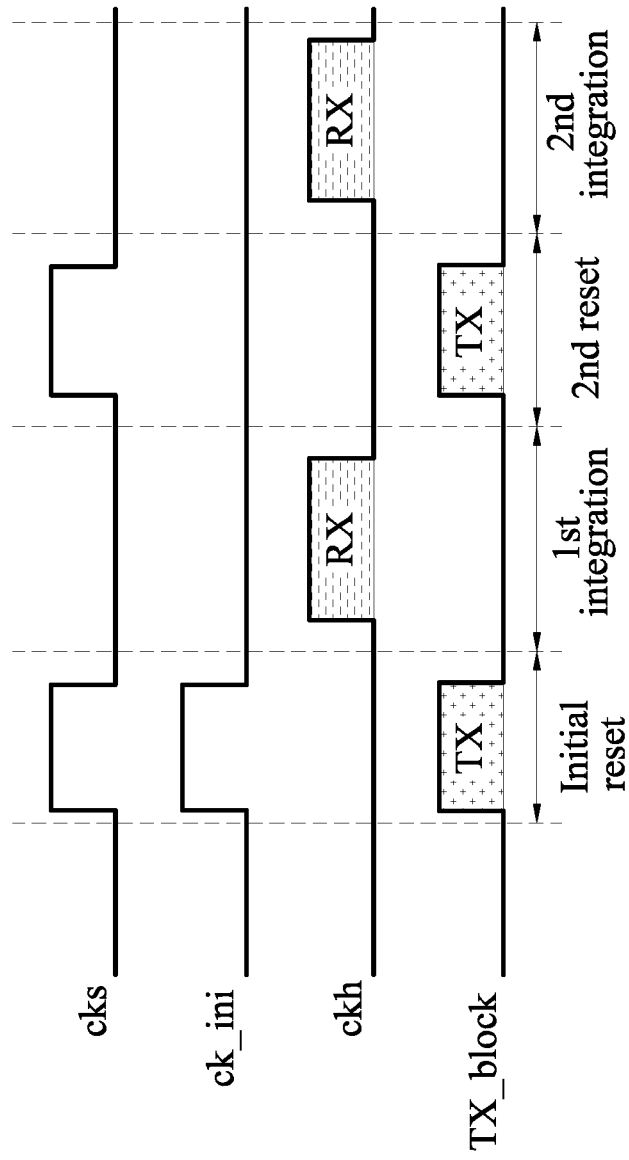
FIG. 4B is a timing diagram of the ultrasonic sensing device depicted in FIG. 4A, in accordance with some embodiments of the present disclosure.

FIG. 4B is a timing diagram 400B of the ultrasonic sensing device depicted in FIG. 4A, in accordance with some embodiments of the present disclosure. The timing diagram 400B includes four signals cks, ck_ini, ckh, and TX_block. The blocking control signal TX_block can be the one discussed in the content of FIG. 1A. These signals can be found to be input to the elements in FIG. 4A.

Referring to FIG. 4B, the blocking control signal TX_block includes one or more pulses. For example, the blocking control signal TX_block can include two pulses. The blocking control signal TX_block is input to the blocking transistor 116, when the ultrasonic signal (i.e., the ultrasonic signal 102 as shown in FIG. 1A) is emitted. The period of the blocking control signal TX_block being logic high may be referred to as the transmission period.

During the initial reset period, the blocking control signal TX_block is logic high. The initial reset period can also be referred to as transmission period (TX). Within this period, the signal cks is logic high, such that the switches S1 and S4 are configured to be closed (i.e., forming the conductive path). Accordingly, the source amplifier 431 and the sink amplifier 441 can have feedback through the switches S1 and S4, respectively. At the same time, the signal ck_ini is logic high as well, such that the switches S3 and S6 are configured to be closed. Meanwhile, the signal ckh is logic low, the switches S2 and S5 are open (i.e., electrically disconnected). In this case, the source capacitor 432 and the sink capacitor 442 can be configured to receive the reset signal Vrst through the switches S3 and S6, respectively.

In some embodiments, the source amplifier 431 and the source capacitor 432 can be the source integrator, and the sink amplifier 441 and the sink capacitor 442 can be the sink integrator. During the initial reset period, the source integrator and the sink integrator would not operate, since the signal Vsense is passed to the lower fixed voltage through the blocking transistor 116 in response to the blocking control signal TX_block. Accordingly, the source rectifier 410 and the sink rectifier 420 remain turned off.

In some embodiments, the sink integrator can be clear to be empty during the initial reset period. In other words, the sink capacitor 442 can be discharged. In some embodiments, the source integrator can be fulfilled during the initial reset period. That is, the source capacitor 432 can be charged.

The first integration period follows the initial reset period. During the first integration period, the blocking control signal TX_block is logic low. The first integration period can also be referred to as a receiving period (RX). Within this period, the signal ckh is logic high, such that the switches S2 and S5 are configured to be closed. Accordingly, the source capacitor 432 and the sink capacitor 442 can be connected to the receiving circuit 119 through the switches S2 and S5, respectively. At the same time, the signals cks and ck_ini are logic low, such that the switches S1, S3, S4, and S6 are configured to be open. In this case, the source amplifier 431 and the sink amplifier 441 can have no feedback.

During the first integration period, the source integrator (i.e., the source amplifier 431 and the source capacitor 432) and the sink integrator (i.e., the sink amplifier 441 and the sink capacitor 442) can operate. In some embodiments, the source output signal Outputp of the source integrator can be the time integral of its input signal. It accumulates the input quantity over a defined time to produce a representative output. Similarly, the sink output signal Outputn of the sink integrator can be the time integral of its input signal. The sink integrator accumulates the input quantity over a defined time to produce a representative output.

In some embodiments, when the signal Vsense exceeds the reference signal Vref, the sink rectifier 420 can be turned on, and the excess charge of the signal Vsense exceeding the reference signal Vcm1 can be passed to the sink integrator. The excess charge can be stored in the sink capacitor 442. The sink output signal Outputn of the sink amplifier 441 can be determined by the receiving circuit 119 to obtain the signal Vsense during ramp-up stage.

In some embodiments, when the signal Vsense is less than the reference signal Vref, the source rectifier 410 can be turned on, and the empty charge of the signal Vsense less than the reference signal Vcm2 can be fulfilled by the charge of the source integrator. The empty charge can be fulfilled by the source capacitor 432. The source output signal Outputp of the source amplifier 431 can be determined by the receiving circuit 119 to obtain the signal Vsense during ramp-down stage.

During the second reset period following the first integration period, the blocking control signal TX_block is logic high again (transmission period). Within this period, the signal cks is logic high, such that the switches S1 and S4 are configured to be closed. Accordingly, the source amplifier 431 and the sink amplifier 441 can have feedback through the switches S1 and S4, respectively. The signal ckh is logic low, such that the switches S2 and S5 are open. Differing from the initial reset period, the signal ck_ini is logic low during the second reset period, such that the switches S3 and S6 are configured to be open.

During the second reset period, the source integrator and the sink integrator do not operate, since the signal Vsense is passed to the lower fixed voltage through the blocking transistor 116 in response to the blocking control signal TX_block. Accordingly, the source rectifier 410 and the sink rectifier 420 remain turned off.

During the second integration period following the second reset period, the blocking control signal TX_block is logic low. Within the second integration period, the elements of the ultrasonic sensing device 400A will operate the same as within the first integration period.

FIG. 4C is a waveform diagram 400C of an ultrasonic sensing device 400A depicted in FIG. 4A, in accordance with some embodiments of the present disclosure. Referring to FIG. 4C, the waveform diagram 400C in FIG. 4C is similar to the waveform diagram 10B in FIG. 1B, differing therefrom in that in FIG. 4C, the waveform diagram 400C further includes the receiving integration signal RX and the received signal $V_{RX}$ at the receiving circuit 119.

During the transmission period (i.e., the blocking control signal TX_block being logic high), the signal Vsense can have a great amplitude due to high-power ultrasonic signal. At the end of the transmission period, the high-power ultrasonic signal will stop transmitting. Meanwhile, the signal Vsense may experience transmission tailing at the end of the transmission of ultrasonic signal. The transmission tailing will occur between the end of the ultrasonic signal and the beginning of the received reflected ultrasonic signal.

During the receiving period RX (i.e., the receiving integration signal RX being logic high), the blocking transistor 116 can be configured to turn off and the source rectifier 410 and the sink rectifier 420 may be turned on. In some embodiments, the received signal $V_{RX}$ at the receiving circuit 119 shows the signal Vsense being processed by the bias shift eliminator 405. In particular, the received signal $V_{RX}$ at the receiving circuit 119 can be obtained from the source output signal Outputp of the source integrator and the sink output signal Outputn of the sink integrator.

Referring to FIG. 4C, the received signal $V_{RX}$ includes a plurality of pulses, each of which has a ramp-up stage and a ramp-down stage. The ramp-up stage (solid line portion) corresponds to the sink output signal Outputn of the sink integrator. The ramp-down stage (dashed line portion) corresponds to the source output signal Outputp of the source integrator. Since the integrators accumulate the ramp-up and ramp-down charge, it would not be affected by the bias shift of the signal Vsense.

The integrator is easy to design since the feedback factor is high with no flicker noise, making it suitable for use in the bias shift eliminator of the ultrasonic sensing device.

Figure 5A:
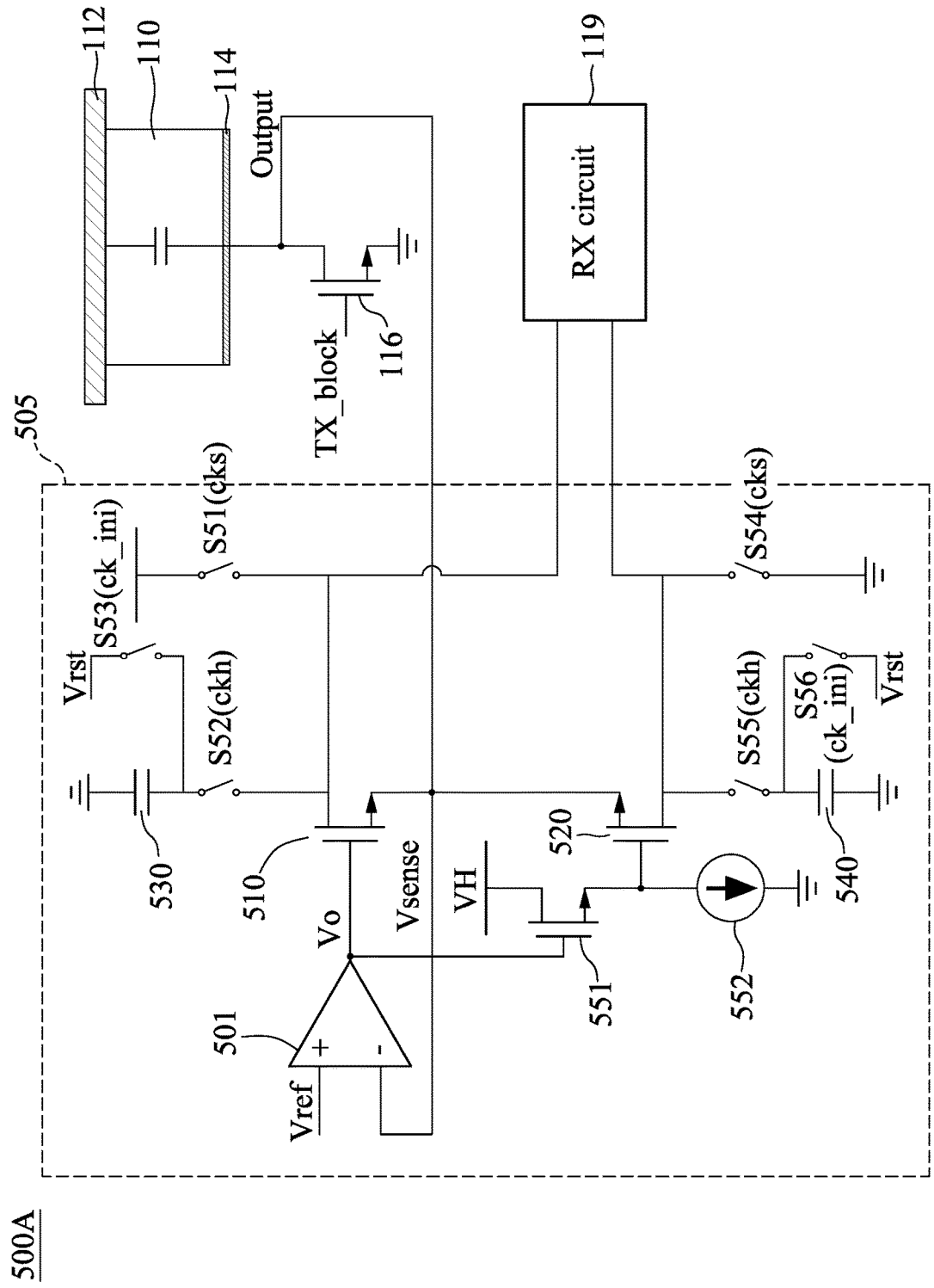
FIG. 5A is a schematic diagram of an ultrasonic sensing device, in accordance with some embodiments of the present disclosure.

FIG. 5A is a schematic diagram of an ultrasonic sensing device 500A, in accordance with some embodiments of the present disclosure. The ultrasonic sensing device 500A includes a piezoelectric element 110, electrodes 112 and 114, a blocking transistor 116, a receiving circuit 119, an amplifier 501, a source rectifier 510, a sink rectifier 520, a source capacitor 530, a sink capacitor 540, a transistor 551, and a current source 552. The ultrasonic sensing device 500A in FIG. 5A is similar to the ultrasonic sensing device 400A in FIG. 4A, differing therefrom in that the source integrator is replaced by the source capacitor 530, and the sink integrator is replaced by the sink capacitor 540.

The amplifier 501, the source rectifier 510, the sink rectifier 520, the transistor 551, and the current source 552 correspond to the amplifier 401, the source rectifier 410, the sink rectifier 420, the transistor 451, and the current source 452, respectively, and thus the descriptions thereof are omitted for clarity.

In some embodiments, the source capacitor 530 can be connected to the drain of the source rectifier 510 through a switch S52. The source capacitor 530 can be connected to the receiving circuit 119 through the switch S52. In some embodiments, the switch S52 can be controlled by a signal ckh. The source capacitor 530 can be configured to receive a reset signal Vrst through a switch S53. In some embodiments, the switch S53 can be controlled by a signal ck_ini. The source capacitor 530 can be connected to the lower fixed voltage. In some embodiments, a switch S51 can be connected between the higher fixed voltage and the receiving circuit 119. The source rectifier 510 can be configured to receive the higher fixed voltage through the switch S51. In some embodiments, the switch S51 can be controlled by a signal cks.

In some embodiments, the sink capacitor 540 can be connected to the drain of the sink rectifier 520 through a switch S55. The sink capacitor 540 can be connected to the receiving circuit 119 through the switch S55. In some embodiments, the switch S55 can be controlled by a signal ckh. The sink capacitor 540 can be configured to receive a reset signal Vrst through a switch S56. In some embodiments, the switch S56 can be controlled by a signal ck_ini. The sink capacitor 540 can be connected to the lower fixed voltage. In some embodiments, a switch S54 can connect the sink rectifier 520 to the lower fixed voltage. The switch S54 can be connected to the receiving circuit 119. In some embodiments, the switch S54 can be controlled by a signal cks.

Figure 5B:
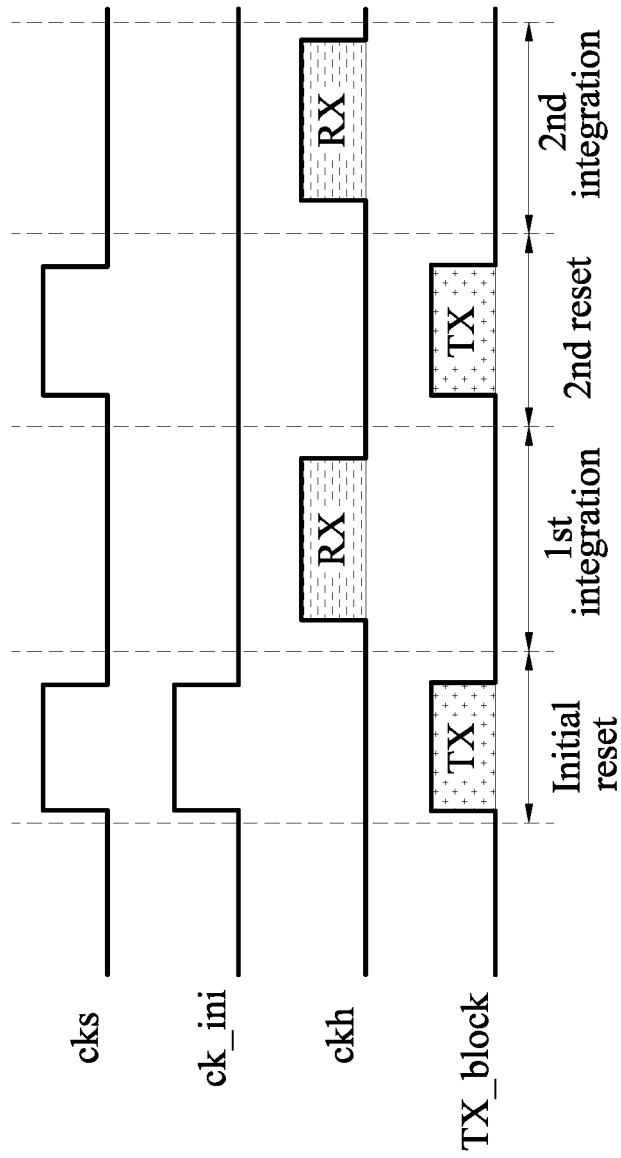
FIG. 5B is a timing diagram of the ultrasonic sensing device depicted in FIG. 5A, in accordance with some embodiments of the present disclosure.

FIG. 5B is a timing diagram 500B of the ultrasonic sensing device 500A depicted in FIG. 5A, in accordance with some embodiments of the present disclosure. The timing diagram 500B includes four signals cks, ck_ini, ckh, and TX_block. These signals can be found to be input to the elements in FIG. 5A. The timing diagram 500B is the same as the timing diagram 400B in FIG. 4B.

During the initial reset period, the blocking control signal TX_block is logic high (i.e., transmission period TX). Within this period, the signal cks is logic high, such that the switches S51 and S54 are configured to be closed. Accordingly, the fixed higher voltage can be connected to the drain of the source rectifier 510 and the receiving circuit 119, and the fixed lower voltage can be connected to the drain of the sink rectifier 520 and the receiving circuit 119. At the same time, the signal ck_ini is logic high as well, such that the switches S53 and S56 are configured to be closed. Meanwhile, the signal ckh is logic low, causing the switches S52 and S55 to be open. In this case, the source capacitor 530 and the sink capacitor 540 can be configured to receive the reset signal Vrst through the switches S53 and S56, respectively. In some embodiments, the sink capacitor 540 can be clear to empty during the initial reset period. In other words, the sink capacitor 540 can be discharged. In some embodiments, the source capacitor 530 can be fulfilled during the initial reset period. That is, the source capacitor 530 can be charged.

Since the signal Vsense is passed to the lower fixed voltage through the blocking transistor 116 in response to the blocking control signal TX_block during the initial reset period, the source rectifier 510 and the sink rectifier 520 remain turned off.

During the first integration period following the initial reset period, the blocking control signal TX_block is logic low. Within the first integration period (receiving period RX), the signal ckh is logic high, such that the switches S52 and S55 are configured to be closed. Accordingly, the source capacitor 530 and the sink capacitor 540 can be connected to the receiving circuit 119 through the switches S52 and S5, respectively. In some embodiments, the source capacitor 530 and the sink capacitor 540 can be connected to the drain of the source rectifier 510 and the drain of the sink rectifier 520 through the switches S52 and S5, respectively. At the same time, the signals cks and ck_ini are logic low, such that the switches S51, S53, S54, and S56 are configured to be open.

In some embodiments, during the first integration period, the source rectifier 510 and the sink rectifier 520 may operate in response to the output signal Vo of the amplifier 501.

In some embodiments, when the signal Vsense exceeds the reference signal Vref, the sink rectifier 520 can be turned on, and the excess charge of the signal Vsense can be passed to the sink capacitor 540 through the sink rectifier 520. The excess charge can be stored in the sink capacitor 540. The excess charge can be obtained by the receiving circuit 119 to determine the signal Vsense during ramp-up stage.

In some embodiments, when the signal Vsense is lower than the reference signal Vref, the source rectifier 510 can be turned on, and the empty charge of the signal Vsense can be fulfilled by the charge of the source capacitor 530. The empty charge can be obtained by the receiving circuit 119 to determine the signal Vsense during ramp-down stage.

During the second reset period following the first integration period, the blocking control signal TX_block is logic high again (transmission period). Within this period, the signal cks is logic high, such that the switches S51 and S54 are configured to be closed. The signal ckh is logic low, the switches S52 and S55 are open. Differing from the initial reset period, the signal ck_ini is logic low during the second reset period, such that the switches S53 and S56 are open.

During the second reset period, the source rectifier 510 and the sink rectifier 520 remain turned off, since the signal Vsense is passed to the lower fixed voltage through the blocking transistor 116 in response to the blocking control signal TX_block.

During the second integration period following the second reset period, the blocking control signal TX_block is logic low. Within the second integration period, the elements of the ultrasonic sensing device 500A will operate the same as they operate within the first integration period.

Figure 6A:
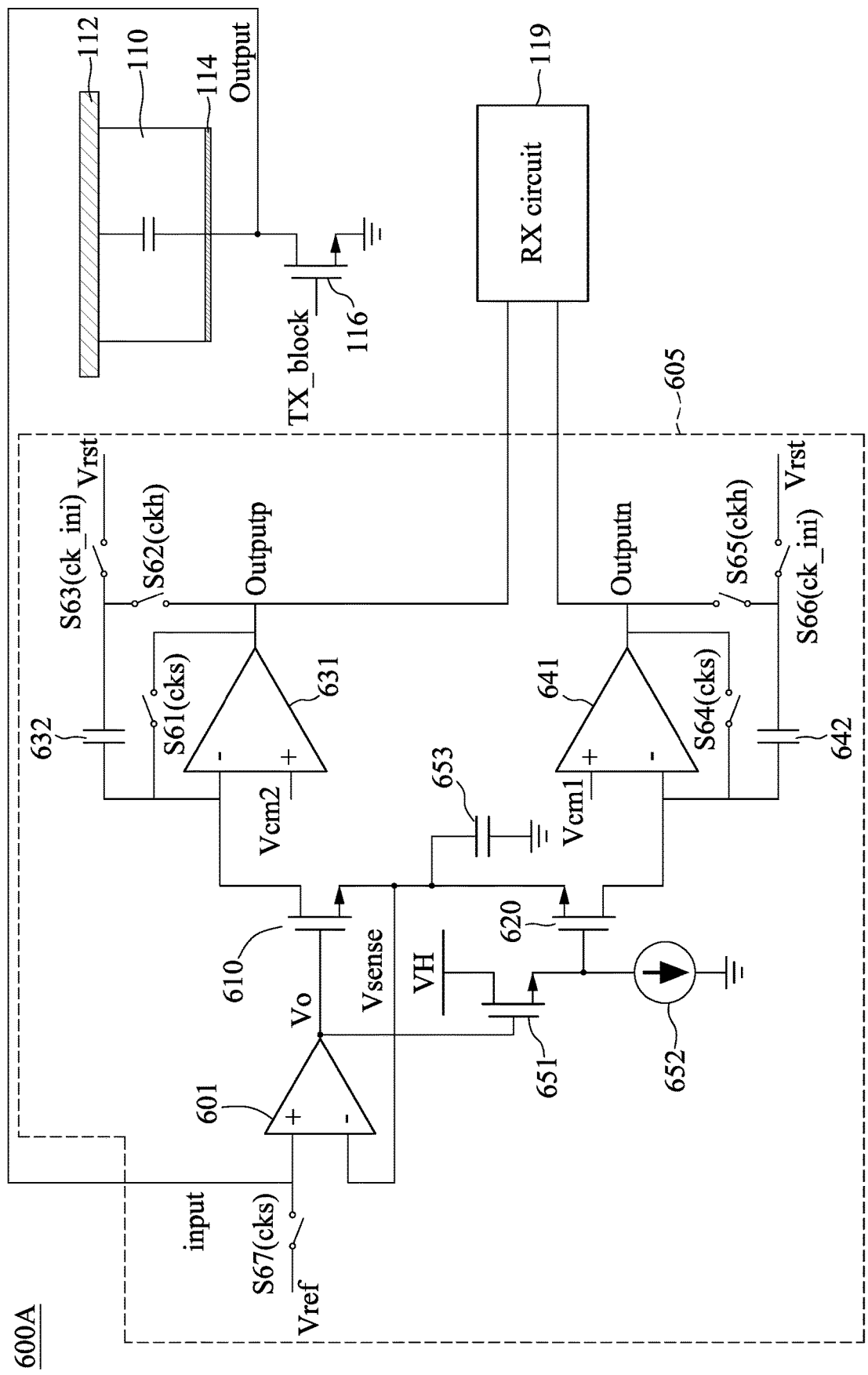
FIG. 6A is a schematic diagram of an ultrasonic sensing device, in accordance with some embodiments of the present disclosure.

FIG. 6A is a schematic diagram of an ultrasonic sensing device 600A, in accordance with some embodiments of the present disclosure. The ultrasonic sensing device 600A includes a piezoelectric element 110, electrodes 112 and 114, a blocking transistor 116, a receiving circuit 119, an amplifier 601, a source rectifier 610, a sink rectifier 620, a source amplifier 631, a sink amplifier 641, a source capacitor 632, a sink capacitor 642, a transistor 651, a current source 652, and a buffer capacitor 653. The ultrasonic sensing device 600A in FIG. 6A is similar to the ultrasonic sensing device 400A in FIG. 4A, differing therefrom in that the bias shift eliminator 605 further includes the buffer capacitor 653 connected to the negative input terminal of the amplifier 601 and the piezoelectric element 110 is connected to the positive input terminal of the amplifier 601 rather than the negative input terminal of the amplifier 601.

Referring to FIG. 6A, the positive input terminal of the amplifier 601 can be configured to receive the reference signal Vref through a switch S67. In some embodiments, the switch S67 can be controlled by a signal cks. The buffer capacitor 653 can be connected to the negative input terminal of the amplifier 601 and the lower fixed voltage. In some embodiments, the buffer capacitor 653 can be connected to the source of the source rectifier 610 and the source of the sink rectifier 620. The buffer capacitor 653 can operate as a rectifier to filter unwanted signals and maintain the voltage level of the signal Vsense. In the ultrasonic sensing device 600A, the amplifier 601 can work as a voltage follower.

Figure 6B:
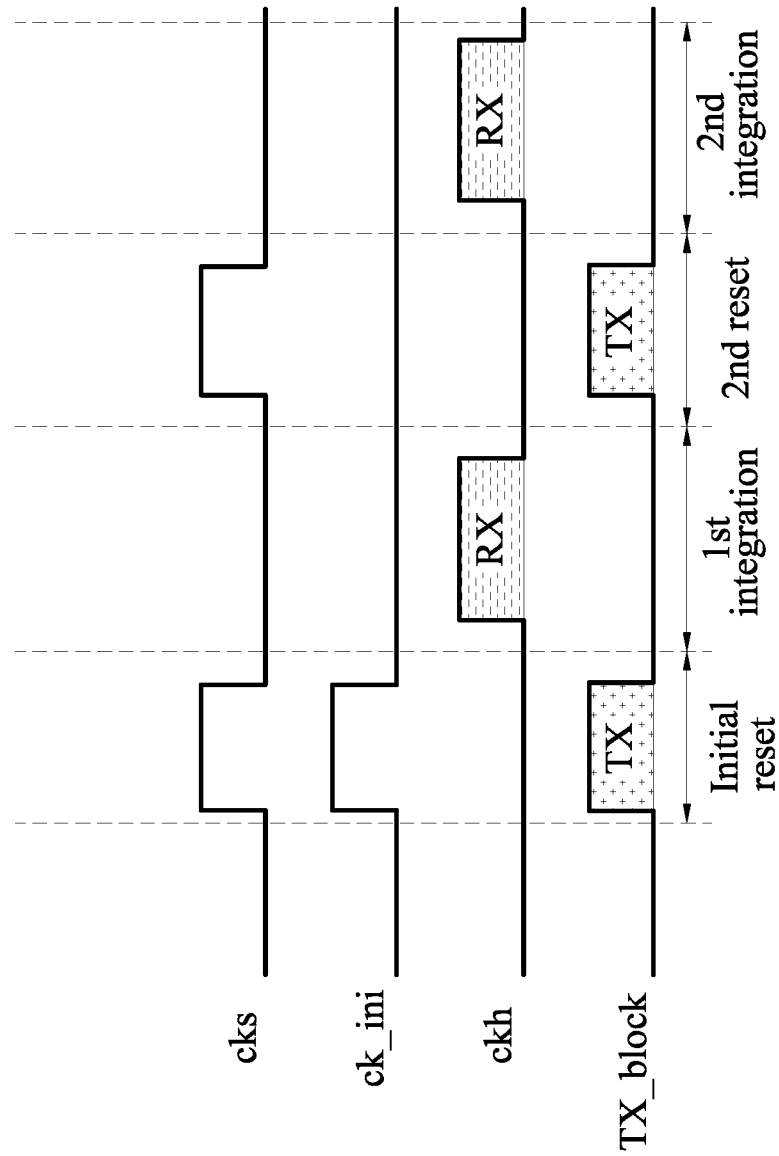
FIG. 6B is a timing diagram of the ultrasonic sensing device depicted in FIG. 6A, in accordance with some embodiments of the present disclosure.

FIG. 6B is a timing diagram 600B of the ultrasonic sensing device 600A depicted in FIG. 6A, in accordance with some embodiments of the present disclosure. The timing diagram 600B includes four signals cks, ck_ini, ckh, and TX_block. These signals can be found to be input to the elements in FIG. 6A. The timing diagram 600B is the same as the timing diagram 400B in FIG. 4B.

During the initial reset period, the blocking control signal TX_block is logic high (i.e., transmission period TX). Within this period, the signal cks is logic high, such that the switches S61, S64, and S67 are configured to be closed. Accordingly, the source amplifier 431 and the sink amplifier 441 can have a feedback through the switches S1 and S4, respectively. The amplifier 601 can be configured to receive the reference signal Vref through the switch S67. At the same time, the signal ck_ini is logic high as well, such that the switches S63 and S66 are configured to be closed. Meanwhile, the signal ckh is logic low, causing the switches S62 and S65 to be open. In this case, the source capacitor 632 and the sink capacitor 642 can be configured to receive the reset signal Vrst through the switches S63 and S66, respectively.

In some embodiments, the source amplifier 631 and the source capacitor 632 can be a source integrator, and the sink amplifier 641 and the sink capacitor 642 can be a sink integrator. During the initial reset period, the source integrator and the sink integrator do not operate, since the signal Vsense is passed to the lower fixed voltage through the blocking transistor 116 in response to the blocking control signal TX_block. Accordingly, the source rectifier 610 and the sink rectifier 620 remain turned off. In some embodiments, the sink integrator can be clear to be empty during the initial reset period. In other words, the sink capacitor 642 can be discharged. In some embodiments, the source integrator can be fulfilled during the initial reset period. That is, the source capacitor 632 can be charged.

During the first integration period following the initial reset period, the blocking control signal TX_block is logic low. Within the first integration period (receiving period RX), the signal ckh is logic high, such that the switches S62 and S65 are configured to be closed. Accordingly, the source capacitor 632 and the sink capacitor 642 can be connected to the receiving circuit 119 through the switches S62 and S65, respectively. At the same time, the signals cks and ck_ini are logic low, such that the switches S61, S63, S64, S66, and S67 are configured to be open. In this case, the source amplifier 631 and the sink amplifier 641 can have no feedback.

During the first integration period, the source integrator (i.e., the source amplifier 631 and the source capacitor 632) and the sink integrator (i.e., the sink amplifier 641 and the sink capacitor 642) can operate. In some embodiments, the source output signal Outputp of the source integrator can be the time integral of its input signal. Similarly, the sink output signal Outputn of the sink integrator can be the time integral of its input signal.

In some embodiments, when the signal Vsense exceeds the reference signal Vref, the sink rectifier 620 can be turned on, and the excess charge of the signal Vsense exceeding the reference signal Vcm1 can be passed to the sink integrator. The excess charge can be stored in the sink capacitor 642. The sink output signal Outputn of the sink amplifier 641 can be determined by the receiving circuit 119 to determine the signal Vsense during ramp-up stage.

In some embodiments, when the signal Vsense is lower than the reference signal Vref, the source rectifier 610 can be turned on, and the empty charge of the signal Vsense lower than the reference signal Vcm2 can be fulfilled by the charge of the source integrator. The empty charge can be fulfilled by the source capacitor 632. The source output signal Outputp of the source amplifier 631 can be determined by the receiving circuit 119 to determine the signal Vsense during ramp-down stage.

During the second reset period following the first integration period, the blocking control signal TX_block is logic high again (transmission period). Within this period, the signal cks is logic high, such that the switches S61 and S64 are configured to be closed. Accordingly, the source amplifier 631 and the sink amplifier 641 can have feedback through the switches S61 and S64, respectively. The signal ckh is logic low, such that the switches S62 and S65 are open. Differing from the initial reset period, the signal ck_ini is logic low during the second reset period, such that the switches S63 and S66 are open.

During the second reset period, the source integrator and the sink integrator would not operate, since the signal Vsense is passed to the lower fixed voltage through the blocking transistor 116 in response to the blocking control signal TX_block. Accordingly, the source rectifier 610 and the sink rectifier 620 remain turned off.

During the second integration period following the second reset period, the blocking control signal TX_block is logic low. Within the second integration period, the elements of the ultrasonic sensing device 600A will operate the same as they operate within the first integration period.

Figure 7A:
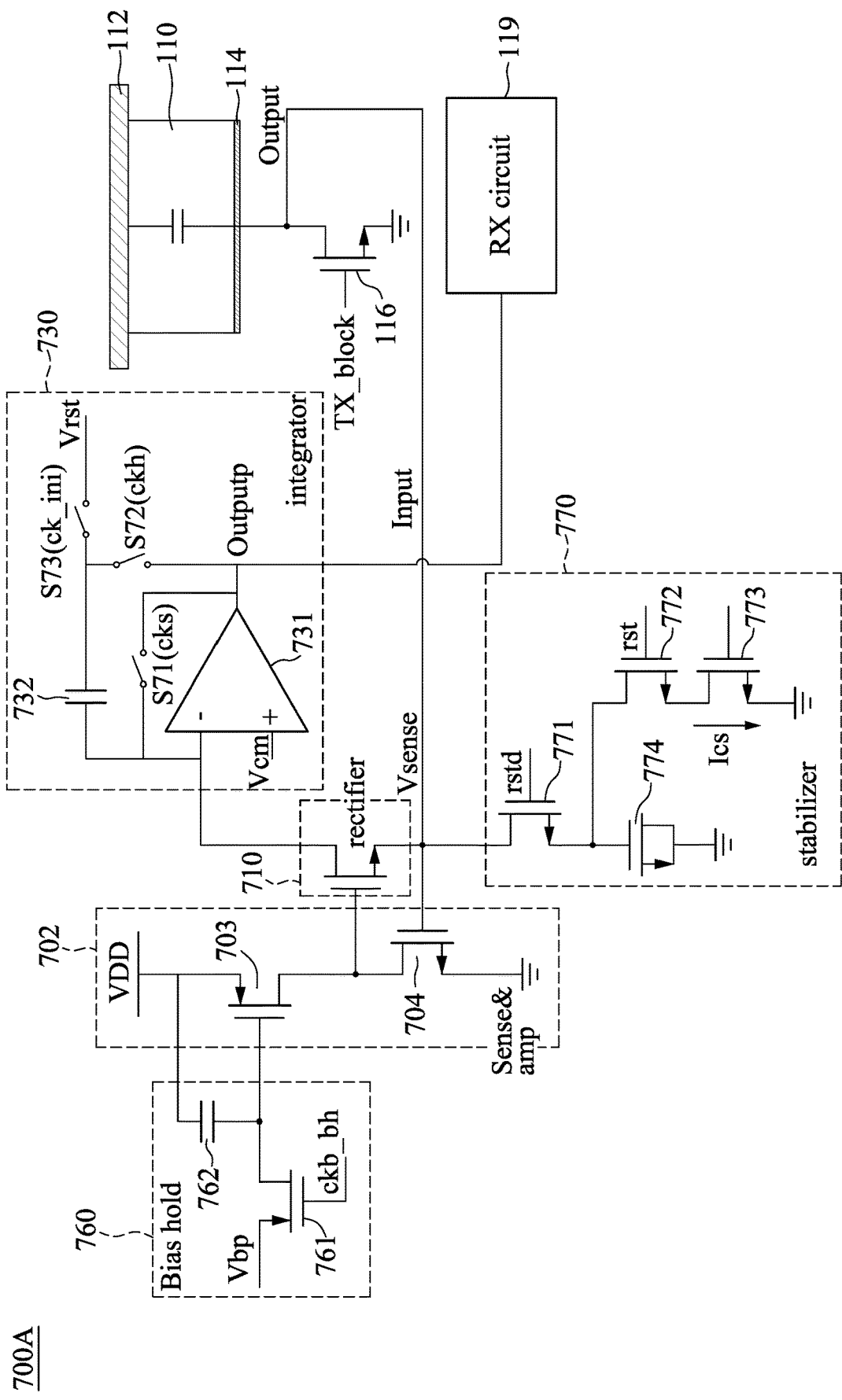
FIG. 7A is a schematic diagram of an ultrasonic sensing device, in accordance with some embodiments of the present disclosure.

FIG. 7A is a schematic diagram of an ultrasonic sensing device 700A, in accordance with some embodiments of the present disclosure. The ultrasonic sensing device 700A includes a piezoelectric element 110, electrodes 112 and 114, a blocking transistor 116, a receiving circuit 119, a sense and amplify unit 702 including transistors 703 and 704, a source rectifier 710, a source integrator 730 including a source amplifier 731 and a source capacitor 732, a bias hold unit 760 including a transistor 761 and a capacitor 762, and a stabilizer unit 770 including stabilizer transistors 771, 772, 773, and 774.

Unlike the bias shift eliminator 405 in FIG. 4A with a source portion and a sink portion, the ultrasonic sensing device 700A in FIG. 7A has a source portion (i.e., the source integrator 730) without a sink portion. The ultrasonic sensing device 700A can include the sense and amplify unit 702, the bias hold 760, and the stabilizer 770, such that the ultrasonic sensing device 700A can operate stably.

In some embodiments, the source rectifier 710 can have a gate, a drain, and a source. The source of the source rectifier 710 can be connected to the electrode 114 of the piezoelectric element 110. In some embodiments, the source rectifier 710 can be connected to the blocking transistor 116.

The source integrator 730 can include the source amplifier 731 and the source capacitor 732. The source amplifier 731 can include a positive input terminal, a negative input terminal, and an output terminal. The positive input terminal of the source amplifier 731 can be configured to receive a reference signal Vcm. In some embodiments, the negative input terminal of the source amplifier 731 can be connected to the drain of the source rectifier 710. The output terminal of source amplifier 731 can be connected to the receiving circuit 119. In some embodiments, the output terminal of the source amplifier 731 can be connected to the negative input terminal of the source amplifier 731 through a switch S71. In some embodiments, the switch S71 can be controlled by a signal cks.

In some embodiments, the source capacitor 732 can be connected to the drain of the source rectifier 710. The source capacitor 732 can be connected to the negative input terminal of the source amplifier 731. The source capacitor 732 can be connected to the output terminal of the source amplifier 731 through the switch S71.

The source capacitor 732 can be configured to receive a reset signal Vrst through a switch S73. In some embodiments, the switch S73 can be controlled by a signal ck_ini. In some embodiments, the source capacitor 732 can be connected to the output terminal of the source amplifier 731 through a switch S72. In some embodiments, the switch S72 can be controlled by a signal ckh. In some embodiments, the source capacitor 732 can be connected to the receiving circuit 119 through the switch S72. In some embodiments, the source integrator 730 can output a source output signal Outputp to the receiving circuit 119.

In some embodiments, the sense and amplify unit 702 can be connected to the electrode 114 of the piezoelectric element 110. The sense and amplify unit 702 can include transistors 703 and 704. In some embodiments, the transistor 703 can be a PMOS. The transistor 704 can be an NMOS. The source of the transistor 703 can be configured to receive the higher fixed voltage (for example, VDD). The drain of the transistor 703 can be connected to the gate of the source rectifier 710. The drain of the transistor 703 can be connected to the drain of the transistor 704. In some embodiments, the gate of the transistor 704 can be connected to the electrode 114 of the piezoelectric element 110. The transistor 704 can be configured to turned on or off in response to the signal Vsense. The source of the transistor 704 can be connected to the lower fixed voltage (for example, the ground).

In some embodiments, the source rectifier 710 and the sense and amplify unit 702 can form a two-stage amplifier. In normal operation, the conductance gm of such amplifier can be low. Therefore, the dominant pole would be located at a node carrying the signal Vsense, and the non-dominant pole is located at the output terminal of the sense and amplifier unit 702 (i.e., the gate of the source rectifier 710).

The bias hold unit 760 can be connected to the sense and amplify unit 702. The bias hold unit 760 can include the transistor 761 and the capacitor 762. The transistor 761 can be a PMOS. The drain of the transistor 761 can be connected to the gate of the transistor 703. The source of the transistor 761 can be configured to receive a signal Vbp. The gate of the transistor 761 can be configured to receive a signal ckb_bh. In some embodiments, the transistor 761 can be controlled by the signal ckb_bh. The capacitor 762 can be connected between the source of the transistor 703 and the gate of the transistor 703. The capacitor 762 can be configured to receive the higher fixed voltage. The capacitor 762 can be connected to the drain of the transistor 761. In some embodiments, receiving the signal Vbp, the bias hold unit 760 can hold the voltage at a stable level, such that none of the ultrasonic sensing devices affect each other. In some embodiments, the bias hold unit 760 can remove the noise from the central bias generator and cross couple effect between the ultrasonic sensing devices.

In some embodiments, the stabilizer unit 770 can include stabilizer transistors 771, 772, 773, and 774. The stabilizer transistors 771, 772, 773, and 774 can be NMOS. The drain of the stabilizer transistor 771 can be connected to the source of the source rectifier 710. In some embodiments, the drain of the stabilizer transistor 771 can be connected to the piezoelectric element 110. The gate of the stabilizer transistor 771 can be configured to receive a signal rstd. In response to the signal rstd, the stabilizer transistor 771 can be configured to turn on or off.

The stabilizer transistor 772 can be connected to the stabilizer transistor 771. The drain of the stabilizer transistor 772 can be connected to the source of the stabilizer transistor 771. The gate of the stabilizer transistor 772 can be configured to receive a signal rst. In response to the signal rst, the stabilizer transistor 772 can be configured to turn on or off. In some embodiments, the stabilizer transistor 772 can be configured to connect the stabilizer transistor 771 to the lower fixed voltage (or the ground).

The drain of the stabilizer transistor 773 can be connected to the source of the stabilizer transistor 772. In some embodiments, the gate of stabilizer transistor 773 can be configured to receive a bias (such as a DC bias), such that the stabilizer 773 can be a current source. The source of the stabilizer transistor 773 can be connected to the lower fixed voltage (or the ground).

The gate of the stabilizer transistor 774 can be connected to the source of the stabilizer transistor 771. The drain of the stabilizer transistor 774 can be connected to the ground. In some embodiments, the drain of the stabilizer transistor 774 can be connected to the source of the same. Accordingly, the stabilizer transistor 774 can work as a capacitor. In some embodiments, the gate of the stabilizer transistor 774 can be one electrode of the capacitor, and the source and the drain of stabilizer transistor 774 can be another electrode of the capacitor.

In the initial reset period and other reset periods, the bias current Ics passing through the stabilizer transistor 773 can be as low as possible, and the compensation capacitor (i.e., the stabilizer transistor 774) can be coupled to the source of the source rectifier 710. Accordingly, the bias voltage supplying the node carrying the signal Vsense can be built and remain stable.

In some embodiments, a source output signal Outputp can be obtained at the output terminal of the source amplifier 731. In some embodiments, the source output signal Outputp can be transmitted to the receiving circuit 119, such that the actual signal Vsense can be determined by the receiving circuit 119 without bias shift. As the ultrasonic sensing device 700A has no sink integrator, only half-wave of the actual signal Vsense can be determined. In some embodiments, the source output signal Outputp of the source integrator 730 can be determined by the receiving circuit 119 to determine the signal Vsense during ramp-down stage.

Figure 7B:
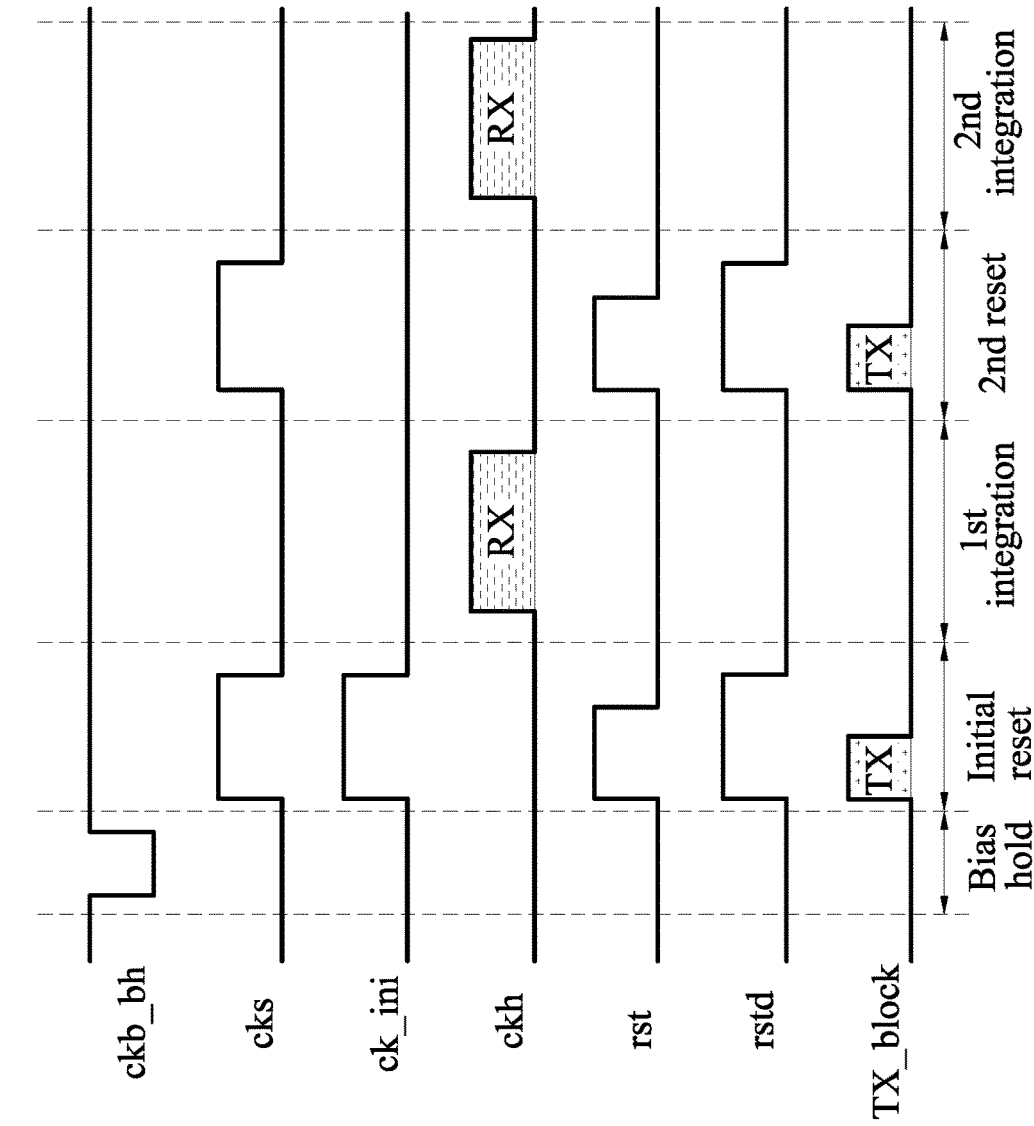
FIG. 7B is a timing diagram of the ultrasonic sensing device depicted in FIG. 7A, in accordance with some embodiments of the present disclosure.

FIG. 7B is a timing diagram 700B of the ultrasonic sensing device 700A depicted in FIG. 7A, in accordance with some embodiments of the present disclosure. The timing diagram 700B includes 7 signals ckb_bh, cks, ck_ini, ckh, rst, rstd, and TX_block. These signals can be found to be input to the elements in FIG. 7A. The timing diagram 700B is similar to the timing diagram 400B in FIG. 4B, differing therefrom in the timing diagram 700B further including the signals rst and rstd.

During the bias hold period, the signal ckb_bh can be input to the transistor 761 to hold the bias being input to the source rectifier 710. In response to the signal ckb_bh being logic low, the transistor 761 can be turned on, such that the signal Vbp can be transmitted to the capacitor 762 and the gate of the transistor 703. In some embodiments, receiving the signal Vbp, the bias hold unit 760 can hold the voltage at a stable level, such that none of the ultrasonic sensing devices affect each other. In some embodiments, the bias hold unit 760 can remove the noise from the central bias generator and cross couple effect between the ultrasonic sensing devices.

Outside the bias hold period, the signal ckb_bh can be logic high, causing the transistor 761 to be turned off. Therefore, the signal Vbp cannot be transmitted to the gate of the transistor 703, and the capacitor 762 can transmit the charge to the gate of the transistor 703.

During the initial reset period, the blocking control signal TX_block is logic high (i.e., transmission period TX). Within this period, the signal cks is logic high, such that the switch S71 is configured to be closed. Accordingly, the source amplifier 731 can have feedback through the switch S71. At the same time, the signal ck_ini is logic high as well, such that the switch S73 is configured to be closed. Meanwhile, the signal ckh is logic low, causing the switch S72 open. In this case, the source capacitor 732 can be configured to receive the reset signal Vrst through the switch S73. During the initial reset period, the signals rst and rstd can be logic high, such that the stabilizer transistors 771 and 772 can be configured to turn on. In some embodiments, the source integrator 730 can be fulfilled during the initial reset period. That is, the source capacitor 732 can be charged.

In some embodiments, the pulse of the blocking control signal TX_block can be shorter than that of the signals cks, ck_ini, rst, and rstd, so that the signals cks, ck_ini, rst, and rstd (especially the signals rst and rstd) can have extra time to settle to a desired bias point after the blocking control signal TX_block. In some embodiments, the pulse of the signal rstd can be shorter than that of the signal rst, such that the stabilizer unit 770 can be set to a desired state.

During the first integration period, the blocking control signal TX_block is logic low. Within the first integration period (receiving period RX), the signal ckh is logic high, such that the switch S72 is configured to be closed. Accordingly, the source capacitor 732 can be connected to the receiving circuit 119 through the switch S72. At the same time, the signals cks and ck_ini are logic low, such that the switches S71 and S73 are configured to be open. In this case, the source amplifier 731 has no feedback. During the first integration period, the signals rst and rstd can be logic low, such that the stabilizer transistors 771 and 772 can be turned off.

During the first integration period, the source output signal Outputp of the source integrator 730 can be the time integral of its input signal. In some embodiments, when the signal Vsense is less than a threshold of the transistor 704, the transistor 704 can be turned on, and thus the source rectifier 710 can be turn on accordingly. Therefore, the empty charge of the signal Vsense can be fulfilled by the charge of the source integrator 730. In some embodiments, the empty charge can be fulfilled by the source capacitor 732. The source output signal Outputp of the source integrator 730 can be determined by the receiving circuit 119 to determine the signal Vsense during ramp-down stage.

In some embodiments, when the signal Vsense is lower than a pre-determined threshold, the transistor 704 can be turned off, so that the gate of the source rectifier 710 can receive the signal VDD through the transistor 703. The source rectifier 710 can then be turned on, and the empty charge of the signal Vsense less than a pre-determined threshold can be fulfilled by the charge of the source integrator 730. The empty charge can be fulfilled by the source capacitor 732. The source output signal Outputp of the source integrator 730 can be determined by the receiving circuit 119 to determine the signal Vsense during ramp-down stage. In some embodiments, since the ultrasonic sensing device 700A merely includes the source portion, the signal determined by the receiving circuit 119 can have half wave of the signal Vsense.

During the second reset period, the blocking control signal TX_block is logic high again (transmission period). Within this period, the signal cks is logic high, such that the switch S71 is configured to be closed. Accordingly, the source amplifier 731 can have feedback through the switch S71. The signal ckh is logic low, such that the switch S72 is open. Differing from the initial reset period, the signal ck_ini is logic low during the second reset period, such that the switch S73 is open. During the second reset period, the signals rst and rstd can be logic high, such that the stabilizer transistors 771 and 772 can be configured to turn on.

Similar to the initial reset period, the pulse of the blocking control signal TX_block can be shorter than that of the signals cks, ck_ini, rst, and rstd, so that the signals cks, ck_ini, rst, and rstd (especially the signals rst and rstd) can have extra time for settling to a desired bias point after the blocking control signal TX_block. In some embodiments, the pulse of the signal rstd can be shorter than that of the signal rst, such that the stabilizer unit 770 can be set to a desired state.

During the second reset period, since the signal Vsense is passed to the lower fixed voltage through the blocking transistor 116 in response to the blocking control signal TX_block, the source rectifier 710 remain turned off.

During the second integration period, the blocking control signal TX_block is logic low. Within the second integration period, the elements of the ultrasonic sensing device 700A will operate the same as they operate within the first integration period.

Figure 7C:
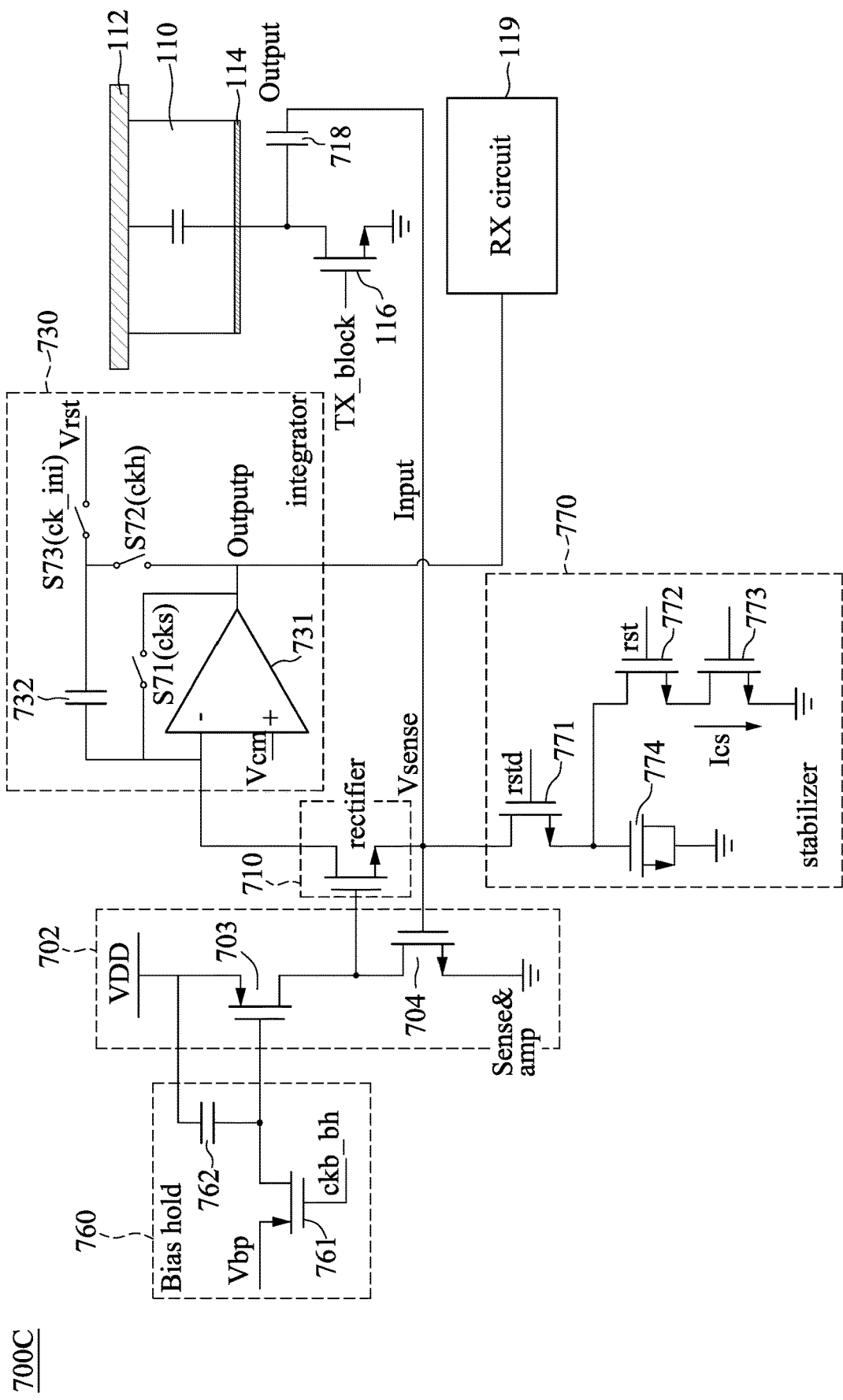
FIG. 7C is a schematic diagram of an ultrasonic sensing device, in accordance with some embodiments of the present disclosure.

FIG. 7C is a schematic diagram of an ultrasonic sensing device 700C, in accordance with some embodiments of the present disclosure. The ultrasonic sensing device 700C is similar to the ultrasonic sensing device 700A in FIG. 7A, differing therefrom in that the ultrasonic sensing device 700C further includes a buffer capacitor 718. Referring to FIG. 7C, the buffer capacitor 718 can be connected between the electrode 114 of the piezoelectric element 110 and the source of the source rectifier 710.

Figure 7D:
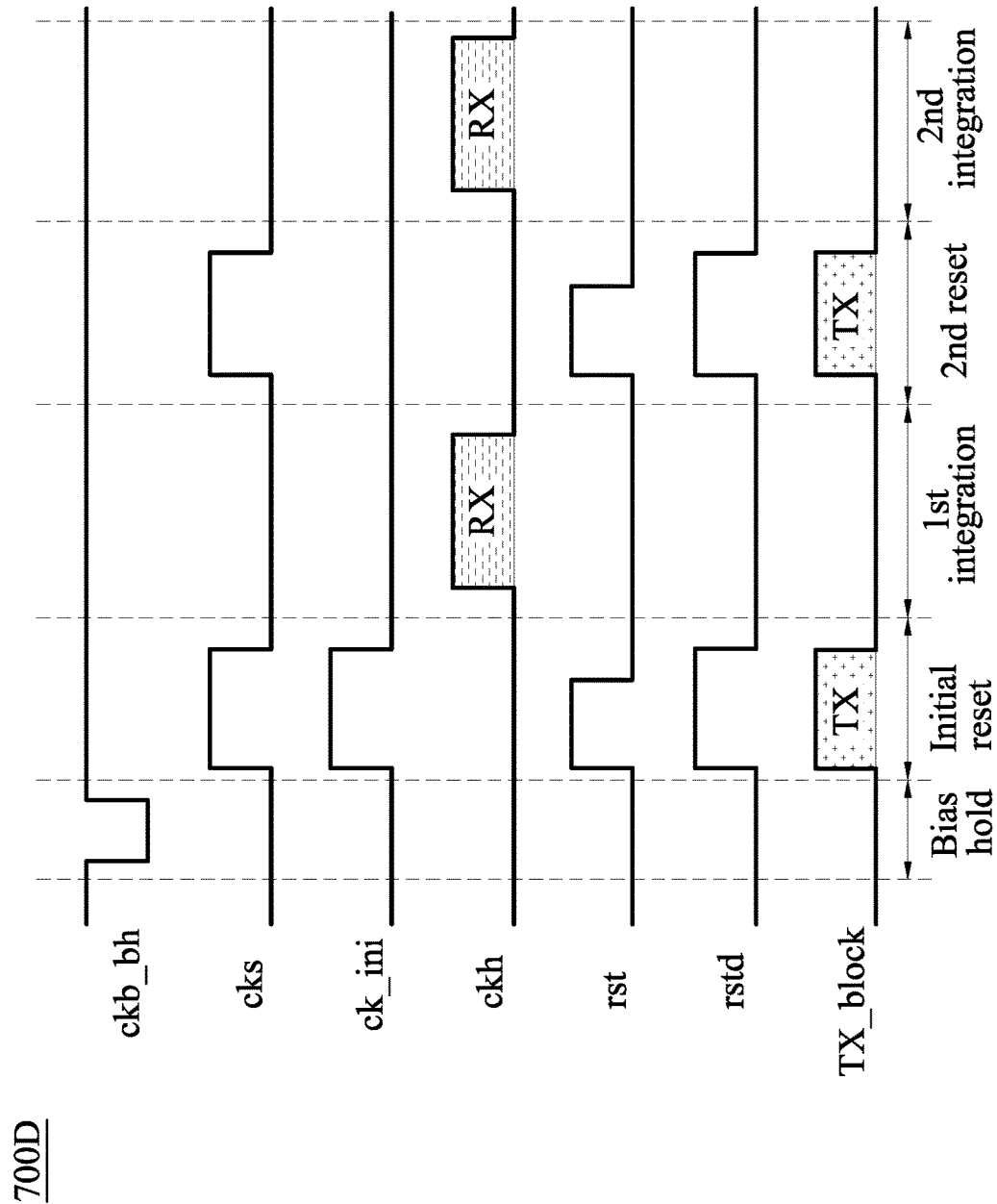
FIG. 7D is a timing diagram of the ultrasonic sensing device depicted in FIG. 7C, in accordance with some embodiments of the present disclosure.

FIG. 7D is a timing diagram 700D of the ultrasonic sensing device 700C depicted in FIG. 7C, in accordance with some embodiments of the present disclosure. The timing diagram 700D is similar to the timing diagram 700B in FIG. 7B, differing therefrom in that the pulse of input setting signals (i.e., the signals rst and rstd) can be shortened as those of the blocking control signal TX_block, since the buffer capacitor 718 provides a buffer. In some embodiments, the pulse of the signals cks and ck_ini can have the same time as the blocking control signal TX_block.

Figure 8A:
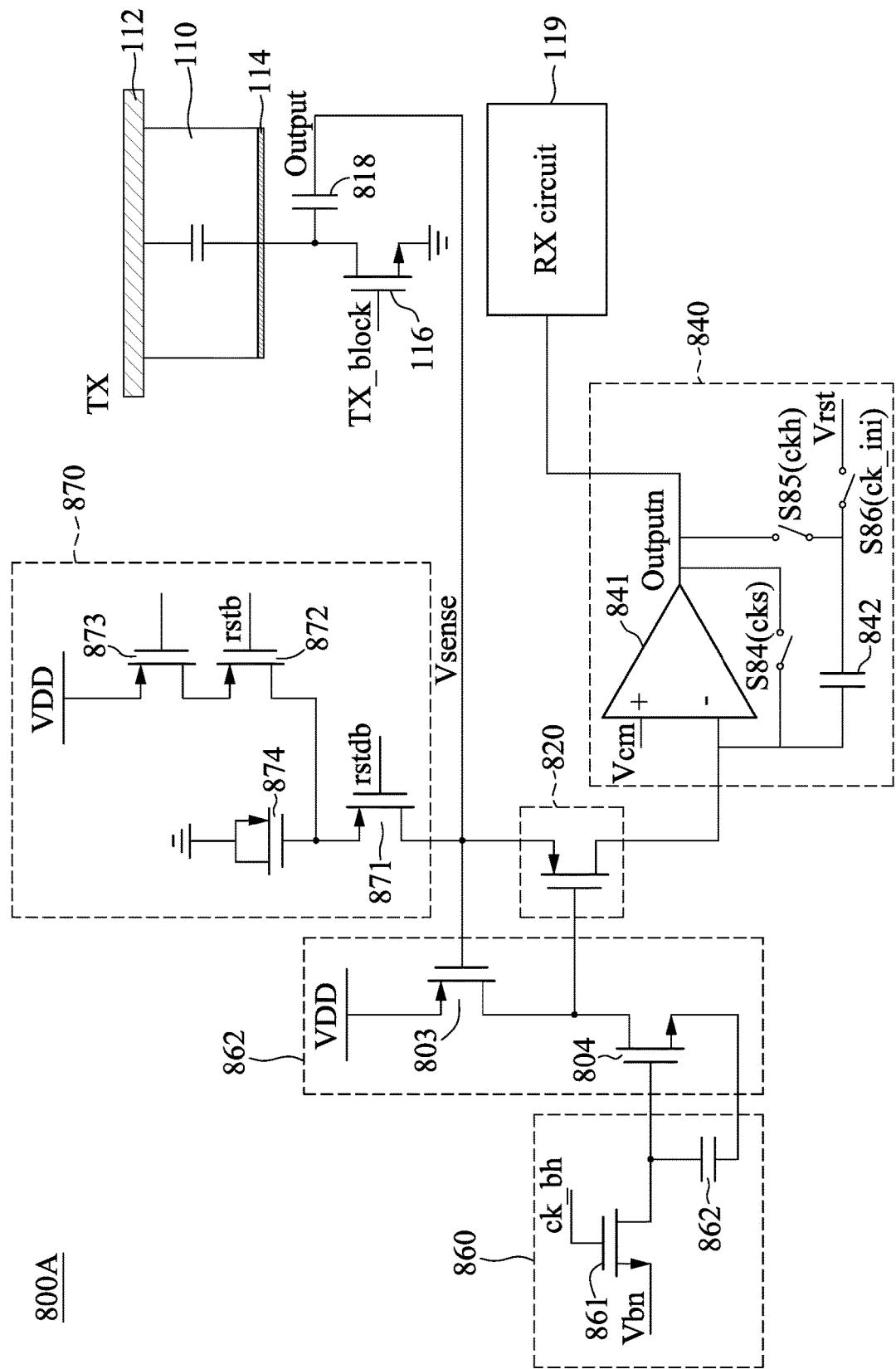
FIG. 8A is a schematic diagram of an ultrasonic sensing device, in accordance with some embodiments of the present disclosure.

FIG. 8A is a schematic diagram of an ultrasonic sensing device 800A, in accordance with some embodiments of the present disclosure. The ultrasonic sensing device 800A includes a piezoelectric element 110 having electrodes 112 and 114, a blocking transistor 116, a receiving circuit 119, a sense and amplify unit 802 including transistors 803 and 804, a buffer capacitor 818, a sink rectifier 820, a sink integrator 840 including a sink amplifier 841 and a sink capacitor 842, a bias hold unit 860 including a transistor 861 and a capacitor 862, and a stabilizer unit 870 including stabilizer transistors 871, 872, 873, and 874. Differing from the ultrasonic sensing device 700A in FIG. 7A having a source portion, the ultrasonic sensing device 800A in FIG. 8A has a sink portion (i.e., the sink integrator 840) without a source portion. In other words, the ultrasonic sensing device 800A is similar to and contrary to the ultrasonic sensing device 700A.

In some embodiments, the sink rectifier 820 can have a gate, a drain, and a source. The source of the sink rectifier 820 can be connected to the electrode 114 of the piezoelectric element 110. In some embodiments, the sink rectifier 820 can be connected to the blocking transistor 116. Referring to FIG. 8A, the buffer capacitor 818 can be connected between the electrode 114 of the piezoelectric element 110 and the source of the sink rectifier 820.

The sink integrator 840 can include the sink amplifier 841 and the sink capacitor 842. The sink amplifier 841 can include a positive input terminal, a negative input terminal, and an output terminal. The positive input terminal of the sink amplifier 841 can be configured to receive a reference signal Vcm. In some embodiments, the negative input terminal of the sink amplifier 841 can be connected to the drain of the sink rectifier 820. The output terminal of sink amplifier 841 can be connected to the receiving circuit 119. In some embodiments, the output terminal of the sink amplifier 841 can be connected to the negative input terminal of the sink amplifier 841 through a switch S84. In some embodiments, the switch S84 can be controlled by a signal cks.

In some embodiments, the sink capacitor 842 can be connected to the drain of the sink rectifier 820. The sink capacitor 842 can be connected to the negative input terminal of the sink amplifier 841. The sink capacitor 842 can be connected to the output terminal of the sink amplifier 841 through the switch S84.

The sink capacitor 842 can be configured to receive a reset signal Vrst through a switch S86. In some embodiments, the switch S86 can be controlled by a signal ck_ini. In some embodiments, the sink capacitor 842 can be connected to the output terminal of the sink amplifier 841 through a switch S85. In some embodiments, the switch S85 can be controlled by a signal ckh. In some embodiments, the sink capacitor 842 can be connected to the receiving circuit 119 through the switch S85. In some embodiments, the sink integrator 840 can output a sink output signal Outputn to the receiving circuit 119.

In some embodiments, the sense and amplify unit 802 can be connected to the electrode 114 of the piezoelectric element 110. The sense and amplify unit 802 can include transistors 803 and 804. In some embodiments, the transistor 803 can be a PMOS. The transistor 804 can be an NMOS. The source of the transistor 803 can be configured to receive the higher fixed voltage (for example, VDD). The drain of the transistor 803 can be connected to the gate of the sink rectifier 820. The drain of the transistor 803 can be connected to the drain of the transistor 804. In some embodiments, the gate of the transistor 803 can be connected to the electrode 114 of the piezoelectric element 110. The transistor 803 can be configured to turned on or off in response to the signal Vsense.

In some embodiments, the transistor 803 of the sense and amplify unit 802 is configured to receive the fixed higher voltage (for example, the power signal VDD), which indicates that the ultrasonic sensing device 800A takes the fixed higher voltage as reference voltage.

The bias hold unit 860 can be connected to the sense and amplify unit 802. The bias hold unit 860 can include the transistor 861 and the capacitor 862. The transistor 861 can be an NMOS. The drain of the transistor 861 can be connected to the gate of the transistor 804. The source of the transistor 861 can be configured to receive a signal Vbn. The gate of the transistor 861 can be configured to receive a signal ck_bh. In some embodiments, the transistor 861 can be controlled by the signal ck_bh. The capacitor 862 can be connected between the source of the transistor 804 and the gate of the transistor 804. That is, the source of the transistor 804 can be connected to the gate of the transistor 804 through the capacitor 862. The capacitor 862 can be connected to the drain of the transistor 861. In some embodiments, receiving the signal Vbn, the bias hold unit 860 can hold the voltage at a stable level, such that none of the ultrasonic sensing devices affect each other.

In some embodiments, the stabilizer unit 870 can include stabilizer transistors 871, 872, 873, and 874. The stabilizer transistors 871, 872, 873, and 874 can be PMOS. The drain of the stabilizer transistor 871 can be connected to the source of the sink rectifier 820. In some embodiments, the drain of the stabilizer transistor 871 can be connected to the piezoelectric element 110. The gate of the stabilizer transistor 871 can be configured to receive a signal rstdb. In response to the signal rstdb, the stabilizer transistor 871 can be configured to turn on or off.

The stabilizer transistor 872 can be connected to the stabilizer transistor 871. The drain of the stabilizer transistor 872 can be connected to the source of the stabilizer transistor 871. The gate of the stabilizer transistor 872 can be configured to receive a signal rstb. In response to the signal rstb, the stabilizer transistor 872 can be configured to turn on or off. In some embodiments, the stabilizer transistor 872 can be configured to connect the stabilizer transistor 871 to the higher fixed voltage (for example, VDD).

The drain of the stabilizer transistor 873 can be connected to the source of the stabilizer transistor 872. In some embodiments, the gate of stabilizer transistor 873 can be configured to receive a bias (such as a DC bias), such that the stabilizer 873 can be a current source. The source of the stabilizer transistor 873 can be connected to the higher fixed voltage (or VDD).

The gate of the stabilizer transistor 874 can be connected to the source of the stabilizer transistor 871. The drain of the stabilizer transistor 874 can be connected to the ground. In some embodiments, the drain of the stabilizer transistor 874 can be connected to the source of the same. Accordingly, the stabilizer transistor 874 can work as a capacitor. In some embodiments, the gate of the stabilizer transistor 874 can be one electrode of the capacitor, and the source and the drain of stabilizer transistor 874 can be another electrode of the capacitor.

In some embodiments, a sink output signal Outputn can be obtained at the output terminal of the sink amplifier 841. In some embodiments, the sink output signal Outputp can be transmitted to the receiving circuit 119, such that the actual signal Vsense can be determined by the receiving circuit 119 without bias shift. As the ultrasonic sensing device 800A has no source integrator, only half-wave of the actual signal Vsense can be determined. In some embodiments, the sink output signal Outputn of the sink integrator 840 can be determined by the receiving circuit 119 to determine the signal Vsense during ramp-up stage.

Figure 8B:
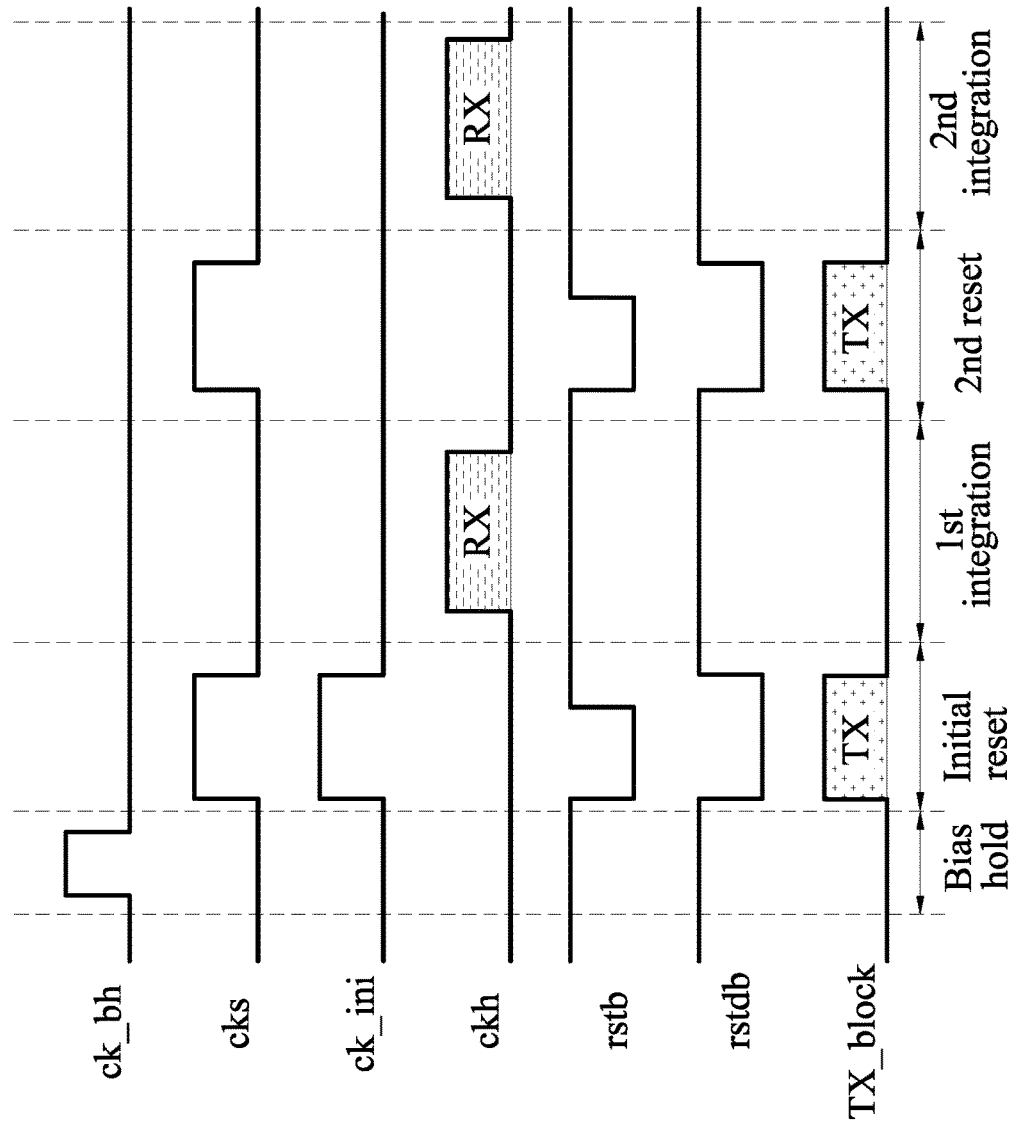
FIG. 8B is a timing diagram of the ultrasonic sensing device depicted in FIG. 8A, in accordance with some embodiments of the present disclosure.

FIG. 8B is a timing diagram 800B of the ultrasonic sensing device 800A depicted in FIG. 8A, in accordance with some embodiments of the present disclosure. The timing diagram 800B includes 7 signals ck_bh, cks, ck_ini, ckh, rstb, rstdb, and TX_block. These signals can be found to be input to the elements in FIG. 8A. The timing diagram 800B is similar to the timing diagram 700D in FIG. 7D, differing therefrom in that the signals rst and rstd are replaced by rstb and rstdb.

During the bias hold period, the signal ck_bh can be input to the transistor 861 to hold the bias being input to the source rectifier 810. In response to the signal ck_bh being logic high, the transistor 861 can be turned on, such that the signal Vbn can be transmitted to the capacitor 862 and the gate of the transistor 803. In some embodiments, the signal Vbn can be a lower voltage, such that the charge can pass from the drain of the transistor 861 to the source of the same.

Outside the bias hold period, the signal ck_bh can be logic low, causing the transistor 861 turned off. Therefore, the charge cannot be transmitted from the capacitor 862 to the signal Vbn (i.e., the lower voltage), and the capacitor 862 can transmit the charge to the gate of the transistor 804.

During the initial reset period, the blocking control signal TX_block is logic high (i.e., transmission period TX). Within this period, the signal cks is logic high, such that the switch S84 is configured to be closed. Accordingly, the sink amplifier 841 can have feedback through the switch S84. At the same time, the signal ck_ini is logic high as well, such that the switch S86 is configured to be closed. Meanwhile, the signal ckh is logic low, causing the switch S85 open. In this case, the sink capacitor 842 can be configured to receive the reset signal Vrst through the switch S86. During the initial reset period, the signals rstb and rstdb can be logic low, such that the stabilizer transistors 871 and 872 can be configured to turn on. In some embodiments, the sink integrator 840 can become empty during the initial reset period. That is, the sink capacitor 842 can be discharged.

During the first integration period, the blocking control signal TX_block is logic low. Within the first integration period (receiving period RX), the signal ckh is logic high, such that the switch S85 is configured to be closed. Accordingly, the sink capacitor 842 can be connected to the receiving circuit 119 through the switch S85. At the same time, the signals cks and ck_ini are logic low, such that the switches S84 and S86 are configured to be open. In this case, the sink amplifier 841 has no feedback. During the first integration period, the signals rstb and rstdb can be logic high, such that the stabilizer transistors 871 and 872 can be turned off.

During the first integration period, the sink output signal Outputn of the sink integrator 840 can be the time integral of its input signal. In some embodiments, when the signal Vsense exceeds a threshold of the transistor 803, the transistor 803 can be turned off, and thus the sink rectifier 820 can be turn on accordingly. Therefore, the excess charge of the signal Vsense can be passed to the sink integrator 840. In some embodiments, the excess charge can be stored in the sink capacitor 842. The sink output signal Outputn of the sink integrator 840 can be determined by the receiving circuit 119 to determine the signal Vsense during ramp-up stage.

In some embodiments, when the signal Vsense exceeds a pre-determined threshold, the transistor 803 can be turned off, so that the gate of the sink rectifier 820 can receive a lower voltage through the transistor 804. The sink rectifier 820 can then be turned on, and the excess charge of the signal Vsense exceeding a pre-determined threshold can be passed to the sink integrator 840. The excess charge can be stored in the sink capacitor 842. The sink output signal Outputn of the sink integrator 840 can be determined by the receiving circuit 119 to determine the signal Vsense during ramp-up stage. In some embodiments, since the ultrasonic sensing device 800A merely includes the sink portion, the signal determined by the receiving circuit 119 can have half wave of the signal Vsense.

During the second reset period, the blocking control signal TX_block is logic high again (transmission period). Within this period, the signal cks is logic high, such that the switch S84 is configured to be closed. Accordingly, the sink amplifier 841 can have feedback through the switch S84. The signal ckh is logic low, such that the switch S85 is open. Differing from the initial reset period, the signal ck_ini is logic low during the second reset period, such that the switch S86 is open. During the second reset period, the signals rstb and rstdb can be logic low, such that the stabilizer transistors 871 and 872 can be configured to turn on.

During the second reset period, since the signal Vsense is passed to the lower fixed voltage through the blocking transistor 116 in response to the blocking control signal TX_block, the sink rectifier 820 remain turned off.

During the second integration period, the blocking control signal TX_block is logic low. Within the second integration period, the elements of the ultrasonic sensing device 800A will operate the same as they operate within the first integration period.

Figure 8C:
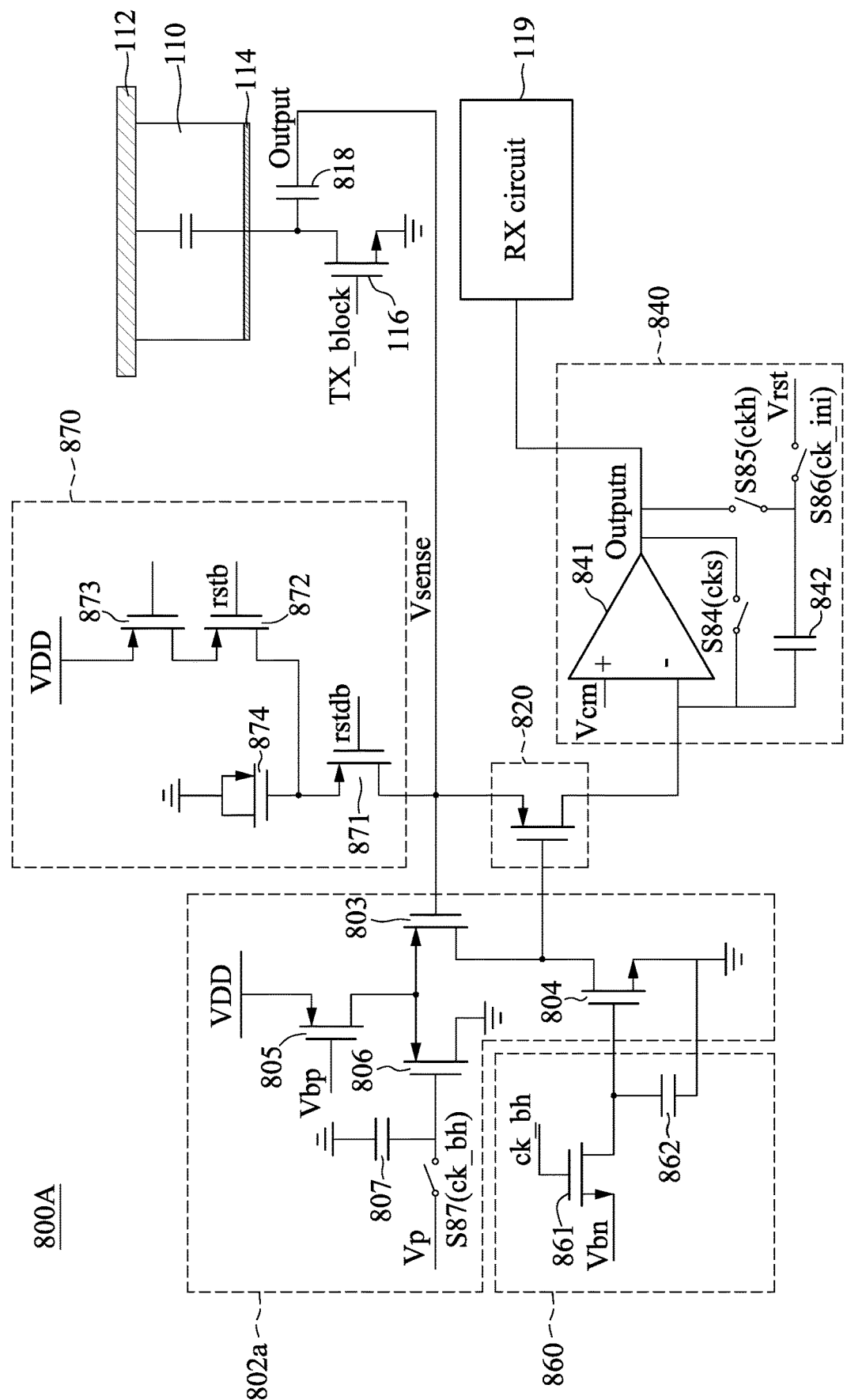
FIG. 8C is a schematic diagram of an ultrasonic sensing device, in accordance with some embodiments of the present disclosure.

FIG. 8C is a schematic diagram of an ultrasonic sensing device 800C, in accordance with some embodiments of the present disclosure. The ultrasonic sensing device 800C is similar to the ultrasonic sensing device 800A in FIG. 8A, differing therefrom in the further inclusion of transistors 805 and 806, and a capacitor 807. Reference symbols in FIG. 8C refer to the same elements as FIG. 8A, and thus descriptions thereof are omitted for clarity.

Referring to FIG. 8C, the transistors 805 and 806 can be PMOS. The transistor 805 can be connected between the higher fixed voltage and the transistor 803. In some embodiments, the source of the transistor 805 can be connected to the higher fixed voltage (for example, VDD). The drain of the transistor 805 can be connected to the source of the transistor 803. The gate of the transistor 805 can be configured to receive a signal Vbp. In some embodiments, the transistor 805 can be turned on or off in response to the signal Vbp.

The source of the transistor 806 can be connected to the drain of the transistor 805. The source of the transistor 806 can be connected to the source of the transistor 803. The drain of the transistor 806 can be connected to a lower fixed voltage (such as the ground). The gate of the transistor 806 can be configured to receive a signal Vp through a switch S87. The switch S87 can be controlled by the signal ck_bh. In some embodiments, the switch S87 and the transistor 861 can be controlled by the same signal.

In some embodiments, the capacitor 807 can be connected to the gate of the transistor 806. The capacitor 807 can be connected to the lower fixed voltage (i.e., the ground). When the switch S87 is turned on, the capacitor 807 can be charged by the signal Vp.

In some embodiments, the sense and amplify unit 802 is configured to receive the signal Vp rather than the fixed higher voltage, which indicates that the ultrasonic sensing device 800C takes the signal Vp as reference voltage.

Figure 8D:
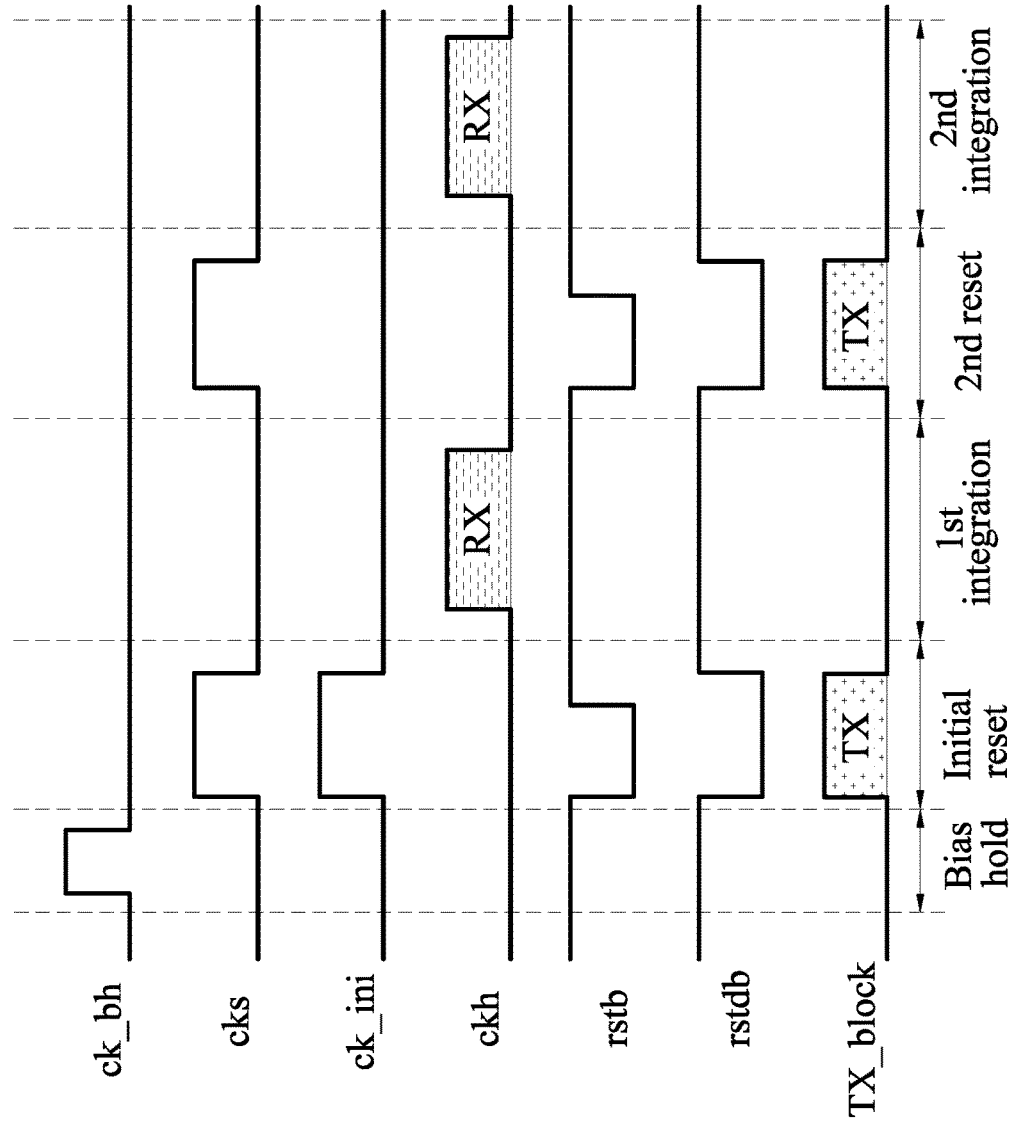
FIG. 8D is a timing diagram of the ultrasonic sensing device depicted in FIG. 8C, in accordance with some embodiments of the present disclosure.

FIG. 8D is a timing diagram 800D of the ultrasonic sensing device 800C depicted in FIG. 8C, in accordance with some embodiments of the present disclosure. The timing diagram 800D can be similar to the timing diagram 800B in FIG. 8B, differing therefrom in that the signal ck_bh also controls the switch S87. In some embodiments, in response to the signal ck_bh being logic low during the bias hold period, the switch S87 can be open.

According to some embodiments, a device for ultrasonic sensing is provided. The device includes a driver circuit configured to generate an ultrasonic signal, a piezoelectric element having a first electrode and a second electrode, a blocking transistor configured to connect the piezoelectric element with the second electrode to a fixed bias voltage, and a source rectifier including a gate, a drain, and a source electrically connected to the piezoelectric element and the blocking transistor. The piezoelectric element is coupled with the driver circuit with the first electrode, and for receiving a reflected ultrasonic signal in response to the ultrasonic signal. The blocking transistor includes a gate for receiving a blocking control signal, a drain electrically connected to the second electrode of the piezoelectric element, and a source electrically connected to the fixed bias voltage, wherein, in response to the blocking signal, the blocking transistor is configured to be turned on within a transmission period and to be turned off within a receiving period.

According to another embodiment, a device for ultrasonic sensing is provided. The device includes a piezoelectric element configured to receive a reflected ultrasonic signal, a blocking transistor configured to connect the piezoelectric element to ground, and a sink rectifier including a gate, a drain, and a source electrically connected to the piezoelectric element and the blocking transistor. The blocking transistor is configured to be turned on within a transmission period, and to be turned off within a receiving period.

According to other embodiments, an ultrasonic sensing device is provided. The ultrasonic sensing device includes a piezoelectric element configured to receive a reflected ultrasonic signal, the piezoelectric element having an electrode, a blocking transistor configured to connect the electrode of the piezoelectric element to a fixed voltage, a first amplifier, a source rectifier, and a sink rectifier. The blocking transistor is configured to be turned on within a transmission period, and to be turned off within a receiving period. The first amplifier has a first input terminal connected to the electrode of the piezoelectric element and the blocking transistor, a second input terminal, and an output terminal. The source rectifier includes a gate electrically connected to the output terminal of the first amplifier, a drain, and a source connected to the second input terminal of the first amplifier. The sink rectifier includes a gate electrically connected to the gate of the source rectifier, a drain, and a source electrically connected to the source of the source rectifier.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, composition of matter, means, methods or steps. In addition, each claim constitutes a separate embodiment, and the combination of various claims and embodiments are within the scope of the present disclosure.

What is claimed is:

1. A device for ultrasonic sensing, comprising:
a driver circuit configured to generate an ultrasonic signal;
a piezoelectric element having a first electrode and a second electrode, the piezoelectric element coupled with the driver circuit with the first electrode, and for receiving a reflected ultrasonic signal in response to the ultrasonic signal;
a blocking transistor configured to connect the piezoelectric element with the second electrode to a fixed bias voltage, wherein the blocking transistor includes a gate for receiving a blocking control signal, a drain electrically connected to the second electrode of the piezoelectric element, and a source electrically connected to the fixed bias voltage, wherein, in response to the blocking control signal, the blocking transistor is configured to be turned on within a transmission period and to be turned off within a receiving period; and
a source rectifier including a gate, a drain, and a source, the source of the source rectifier being directly connected to the piezoelectric element and the blocking transistor.

2. The device of claim 1, further comprising:
a sink rectifier including a gate, a drain, and a source electrically connected to the piezoelectric element.

3. The device of claim 2, further comprising:
a first amplifier including an input terminal connected to the source of the source rectifier and an output terminal connected to the gate of the source rectifier,
wherein the gate of the sink rectifier is electrically connected to the gate of the source rectifier.

4. The device of claim 3, further comprising a buffer including an input terminal connected to the first electrode of the piezoelectric element and an output terminal connected to the source of the source rectifier.

5. The device of claim 4, further comprising a first capacitor connected between the output terminal of the buffer and the source of the source rectifier.

6. The device of claim 4, wherein the buffer is an amplifier.

7. The device of claim 3, further comprising:
a second amplifier including an input terminal connected to the source of the sink rectifier and an output terminal connected to the gate of the sink rectifier.

8. The device of claim 2, further comprising:
a source amplifier including an input terminal connected to the drain of the source rectifier and an output terminal connected to the input terminal through a first switch; and
a source capacitor connected between the input terminal and the output terminal of the source amplifier through a second switch,
wherein the first switch is configured to be turned on and the second switch is configured to be turned off within the transmission period, and wherein the first switch is configured to be turned off and the second switch is configured to be turned on within the receiving period.

9. The device of claim 8, further comprising:
a sink amplifier including an input terminal connected to the drain of the sink rectifier and an output terminal connected to the input terminal of the sink amplifier through a third switch; and
a sink capacitor connected between the input terminal and the output terminal of the sink amplifier through a fourth switch,
wherein the third switch is configured to be turned on and the fourth switch is configured to be turned off within the transmission period, and wherein the third switch is configured to be turned off and the fourth switch is configured to be turned on within the receiving period.

10. The device of claim 9, further comprising:
a source reset switch connected to the source capacitor, the source reset switch configured to transmit a reset signal to the source capacitor; and
a sink reset switch connected to the sink capacitor, the sink reset switch configured to transmit the reset signal to the source capacitor,
wherein the source reset switch and the sink reset switch are configured to be turned on within the transmission period, and to be turned off within the receiving period.

11. The device of claim 9, further comprising:
a first transistor including a gate connected to the gate of the source rectifier, a drain configured to receive a higher fixed voltage, and a source connected to the gate of the sink rectifier; and
a current source configured to connect the source of the first transistor to a lower fixed voltage.

12. The device of claim 2, further comprising:
a source capacitor connected to the drain of the source rectifier through a fifth switch; and
a sixth switch connected to the drain of the source rectifier, wherein the source rectifier is configured to receive a higher fixed voltage through the sixth switch,
wherein the fifth switch is configured to be turned off and the sixth switch is configured to be turned on within the transmission period, and wherein the fifth switch is configured to be turned on and the sixth switch is configured to be turned off within the receiving period.

13. The device of claim 12, further comprising:
a sink capacitor connected to the drain of the sink rectifier through a seventh switch; and
an eighth switch connected to the drain of the sink rectifier, wherein the sink rectifier is configured to be connected to a lower fixed voltage through the eighth switch,
wherein the seventh switch is configured to be turned off and the eighth switch is configured to be turned on within the transmission period, and wherein the seventh switch is configured to be turned on and the eighth switch is configured to be turned off within the receiving period.

14. The device of claim 13, further comprising:
a source reset switch connected to the source capacitor, the source reset switch configured to transmit a reset signal to the source capacitor; and
a sink reset switch connected to the sink capacitor, the sink reset switch configured to transmit the reset signal to the source capacitor,
wherein the source reset switch and the sink reset switch are configured to be turned on within the transmission period, and to be turned off within the receiving period.

15. The device of claim 1, further comprising:
a source amplifier including an input terminal connected to the drain of the source rectifier and an output terminal connected to the input terminal through a ninth switch; and
a source capacitor connected between the input terminal and the output terminal of the source amplifier through a tenth switch,
wherein the ninth switch is configured to be turned on and the tenth switch is configured to be turned off within the transmission period, and wherein the ninth switch is configured to be turned off and the tenth switch is configured to be turned on within the receiving period.

16. The device of claim 15, further comprising:
a first transistor including a gate connected to the source of the source rectifier, a drain connected to the gate of the source rectifier, and a source connected to the ground; and
a second transistor including a gate, a drain connected to the gate of the source rectifier, and a source configured to receive the power.

17. The device of claim 15, further comprising:
a stabilizer unit configured to connect the source of the source rectifier to ground, the stabilizer unit including:
a first stabilizer transistor connected to the source of the source rectifier;
a second stabilizer transistor configured to connect the first stabilizer transistor to the ground; and
a third stabilizer transistor having a gate connected to the first stabilizer transistor, a drain connected to the ground, and a source connected to the drain of the third stabilizer transistor.

18. The device of claim 2, wherein the sink rectifier is a P-MOS operating in a saturation region.

19. The device of claim 1, further comprising:
a buffer capacitor connected between the first electrode of the piezoelectric element and the source of the source rectifier.

20. The device of claim 1, wherein the source rectifier is an N-MOS operating in a saturation region.

21. A device for ultrasonic sensing, comprising:
a piezoelectric element configured to receive a reflected ultrasonic signal;
a blocking transistor configured to connect the piezoelectric element to ground, wherein the blocking transistor is configured to be turned on within a transmission period, and to be turned off within a receiving period; and
a source rectifier including a gate, a drain, and a source, the source of the source rectifier being directly connected to the piezoelectric element and the blocking transistor; and
a sink rectifier including a gate, a drain, and a source, the source of the sink rectifier being directly connected to the piezoelectric element and the blocking transistor.

22. The device of claim 21, further comprising:
a sink amplifier including an input terminal connected to the drain of the sink rectifier and an output terminal connected to the input terminal of the sink amplifier through a first switch; and
a sink capacitor connected between the input terminal and the output terminal of the sink amplifier through a second switch,
wherein the first switch is configured to be turned on and the second switch is configured to be turned off within the transmission period, and wherein the first switch is configured to be turned off and the second switch is configured to be turned on within the receiving period.

23. The device of claim 22, further comprising:
a first transistor including a gate connected to the source of the sink rectifier, a drain, and a source configured to receive a power signal; and
a second transistor including a gate, a drain connected to the gate of the sink rectifier, and a source.

24. The device of claim 23, further comprising:
a stabilizer unit configured to connect the source of the sink rectifier to receive the power signal, the stabilizer unit including:
a first stabilizer transistor connected to the source of the sink rectifier;
a second stabilizer transistor configured to transmit the power signal to the first stabilizer transistor; and
a third stabilizer transistor having a gate connected to the first stabilizer transistor, a drain connected to the ground, and a source connected to the drain of the third stabilizer transistor.

25. The device of claim 23, wherein the sink rectifier is a P-MOS operating in a saturation region.

26. An ultrasonic sensing device, comprising:
a piezoelectric element configured to receive a reflected ultrasonic signal, the piezoelectric element having an electrode;
a blocking transistor configured to connect the electrode of the piezoelectric element to a fixed voltage, wherein the blocking transistor is configured to be turned on within a transmission period, and to be turned off within a receiving period;
a first amplifier having a first input terminal connected to the electrode of the piezoelectric element and the blocking transistor, a second input terminal, and an output terminal;
a source rectifier including a gate directly connected to the output terminal of the first amplifier, a drain, and a source directly connected to the second input terminal of the first amplifier; and
a sink rectifier including a gate electrically connected to the gate of the source rectifier, a drain, and a source directly connected to the source of the source rectifier.

27. The ultrasonic sensing device of claim 26, further comprising:
a source amplifier including an input terminal connected to the drain of the source rectifier and an output terminal connected to the input terminal through a first switch;
a source capacitor connected between the input terminal and the output terminal of the source amplifier through a second switch;
a sink amplifier including an input terminal connected to the drain of the sink rectifier and an output terminal connected to the input terminal of the sink amplifier through a third switch; and
a sink capacitor connected between the input terminal and the output terminal of the sink amplifier through a fourth switch,
wherein the first switch and the third switch are configured to be turned on and the second switch and the fourth switch are configured to be turned off within the transmission period, and wherein the first switch and the third switch are configured to be turned off and the second switch and the fourth switch are configured to be turned on within the receiving period.

28. The ultrasonic sensing device of claim 27, further comprising:
a first transistor including a gate connected to the gate of the source rectifier, a drain configured to receive a power signal, and a source connected to the gate of the sink rectifier; and
a current source configured to connect the source of the first transistor to the ground.

29. The ultrasonic sensing device of claim 26, further comprising:
a buffer capacitor connected to the second input terminal of the first amplifier.

30. The ultrasonic sensing device of claim 26, wherein the source rectifier is an N-MOS operating in a saturation region, and wherein the sink rectifier is a P-MOS operating in a saturation region.

* * * * *